United States Patent
Lee et al.

(10) Patent No.: US 12,308,848 B2
(45) Date of Patent: May 20, 2025

(54) PHASE-LOCKED LOOP DEVICE AND OPERATION METHOD THEREOF

(71) Applicant: SAMSUNG ELECTRONICS CO., LTD., Suwon-si (KR)

(72) Inventors: Jusung Lee, Suwon-si (KR); Wonsik Yu, Suwon-si (KR); Youngwoo Jo, Suwon-si (KR); Wooseok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 18/142,939

(22) Filed: May 3, 2023

(65) Prior Publication Data

US 2024/0120927 A1 Apr. 11, 2024

(30) Foreign Application Priority Data

Oct. 6, 2022 (KR) .......................... 10-2022-0128090

(51) Int. Cl.
*H03L 7/091* (2006.01)
*H03L 7/089* (2006.01)

(52) U.S. Cl.
CPC .............. *H03L 7/091* (2013.01); *H03L 7/089* (2013.01)

(58) Field of Classification Search
CPC .................................. H03L 7/089; H03L 7/091
See application file for complete search history.

(56) References Cited

U.S. PATENT DOCUMENTS

| | | | |
|---|---|---|---|
| 6,222,401 B1 | 4/2001 | Yoon | |
| 6,504,437 B1 | 1/2003 | Nelson et al. | |
| 8,816,781 B2 | 8/2014 | Huynh | |
| 9,071,236 B1 | 6/2015 | Masferrer et al. | |
| 9,742,380 B1 | 8/2017 | Raj et al. | |
| 9,991,897 B1* | 6/2018 | Park | H03L 7/099 |
| 10,425,092 B2 | 9/2019 | Shu et al. | |
| 10,615,803 B2 | 4/2020 | Nagam et al. | |
| 10,972,109 B2* | 4/2021 | Kundu | H03L 7/113 |

(Continued)

OTHER PUBLICATIONS

Raj et al., "A 164fs$_{rms}$ 9-to-18GHz Sampling Phase Detector based PLL with In-Band Noise Suppression and Robust Frequency Acquisition in 16nm FinFET," 2017 Symposium on VLSI Circuits, Jun. 5, 2017, Total 3 pages.

(Continued)

*Primary Examiner* — Patrick O Neill
(74) *Attorney, Agent, or Firm* — Sughrue Mion, PLLC

(57) ABSTRACT

A phase-locked loop device and its operating method are provided. The phase-locked loop device includes a voltage controlled oscillator configured to generate an output clock signal, a divider configured to divide the output clock signal into first and second phase division signals having a constant phase difference, a sampling phase frequency detector configured to sample a sampling voltage based on the first phase division signal and output any one of the sampling voltage, a first supply voltage, and a second supply voltage based on the second phase division signal, a transconductance circuit configured to output a conversion current based on a hold voltage, and a loop filter configured to generate a voltage control signal based on the conversion current and output the voltage control signal to the voltage controlled oscillator.

20 Claims, 21 Drawing Sheets

(56) References Cited

U.S. PATENT DOCUMENTS

| | | |
|---|---|---|
| 11,139,818 B1 | 10/2021 | Huang et al. |
| 11,277,143 B1* | 3/2022 | Kundu ................. H03L 7/093 |
| 2019/0212703 A1* | 7/2019 | Yao ..................... H03M 1/48 |
| 2020/0119739 A1 | 4/2020 | Shin et al. |
| 2021/0013888 A1* | 1/2021 | Kim ..................... H03L 7/145 |
| 2022/0014227 A1 | 1/2022 | Chang et al. |
| 2022/0085822 A1 | 3/2022 | Kundu et al. |
| 2023/0122691 A1* | 4/2023 | Kim ..................... H03L 7/099 327/156 |

OTHER PUBLICATIONS

Wu et al., "A 28-nm 75-fs$_{rms}$ Analog Fractional-N Sampling PLL With a Highly Linear DTC Incorporating Background DTC Gain Calibration and Reference Clock Duty Cycle Correction," IEEE Journal of Solid-State Circuits, vol. 54, No. 5, Mar. 12, 2019, Total 13 pages.

Hsu et al., "A 2.2GHZ PLL using a Phase-Frequency Detector with an Auxiliary Sub-Sampling Phase Detector for In-Band Noise Suppression," 2011 IEEE Custom Integrated Circuits Conference (CICC), Sep. 19, 2011, Total 5 pages.

Communication dated Mar. 26, 2024, issued by the European Patent Office in European Application No. 23180468.3.

Xu et al., "A calibration-free multi-phase sampling Type-II PLL", 2021 IEEE International Conference on Integrated Circuits, Technologies and Applications (ICTA), IEEE, Nov. 24, 2021, pp. 111-112 (2 pages total).

Dongyi et al., "A Fractional—N Reference Sampling PLL With Linear Sampler and CDAC Based Fractional Spur Cancellation", IEEE Journal of Solid-State Circuits, IEEE, USA, vol. 56, No. 3, Mar. 2021, 694-704 (11 pages total).

* cited by examiner

PHASE-LOCKED LOOP DEVICE AND OPERATION METHOD THEREOF

CROSS-REFERENCE TO RELATED APPLICATION

This application is based on and claims priority under 35 U.S.C. § 119 to Korean Patent Application No. 10-2022-0128090, filed on Oct. 6, 2022, in the Korean Intellectual Property Office, the disclosure of which is incorporated by reference herein in its entirety.

BACKGROUND

The present disclosure relates to an electronic device, and more particularly, to a phase-locked loop device for achieving phase synchronization only with a main loop and an operating method thereof.

Recently, in the field of 5G communication technology, the need for a phase-locked loop (PLL) having high data rate (HDR) and high-performance jitter removal specifications has been increasing. For a PLL, which typically includes a charge pump, it is difficult to achieve the fast frequency and jitter specifications required by the 5G standard.

To achieve the fast frequency and jitter specifications required by the 5G standard, sampling PLLs, such as sub-sampling PLLs, are being devised. However, in the case of a sampling PLL, a lock range for achieving phase lock is relatively narrow, so it is difficult to stably achieve phase lock. To secure a fixed range, a separate loop, such as a frequency locking loop, is added to the sampling PLL, which makes it difficult to reduce manufacturing cost and promote integration.

SUMMARY

Embodiments provide a method and device for achieving phase locking only with a main loop omitting a frequency locked loop.

According to an aspect of the present disclosure, a phase-locked loop device includes: a voltage controlled oscillator configured to generate an output clock signal; a divider configured to divide the output clock signal into a first phase division signal and a second phase division signal, the first phase division signal and the second phase division signal having a constant phase difference; a sampling phase frequency detector configured to sample, based on the first phase division signal, a sampling voltage generated at a sampling node according to a reference clock signal and output, based on the second phase division signal, any one of the sampling voltage, a first supply voltage, and a second supply voltage having a lower level than the first supply voltage to a hold node; a transconductance circuit configured to output a conversion current based on a hold voltage generated at the hold node; and a loop filter configured to generate a voltage control signal based on the conversion current and output the voltage control signal to the voltage controlled oscillator.

According to an aspect of the present disclosure, an operating method of a phase-locked loop device that synchronizes a reference clock signal with an output clock signal, includes: receiving the reference clock signal and first and second phase division signals divided from the output clock signal; sampling, based on the first phase division signal, a sampling voltage generated at a sampling node according to the reference clock signal; applying, based on the second phase division signal, any one of the sampling voltage, a first supply voltage, and a second supply voltage lower than the first supply voltage as a hold voltage to a hold node; and performing feedback control for synchronizing the reference clock signal with the output clock signal based on the hold voltage.

According to an aspect of the present disclosure, a phase-locked loop circuit for synchronizing a reference clock signal with an output clock signal, includes: a first circuit including a sampling phase detection circuit connected between an input node to which the reference clock signal is input and a hold node, an up switch connected between a first node to which a first supply voltage is applied and the hold node, and a down switch connected between a second node to which a second supply voltage is applied and the hold node; a second circuit connected between a first input terminal to which a sampling voltage is input, a second input terminal into which a first phase division signal divided from the output clock signal is input, a third input terminal to which an inverted sampling voltage obtained by inverting the sampling voltage is input, a first terminal from which a first selection signal is output, a second terminal from which a second selection signal is output and a third terminal from which a third selection signal is output; and a third circuit connected between an input terminal to which a second phase division signal divided from the output clock signal is input, a plurality of input terminals to which the first selection signal, the second selection signal and the third selection signal are respectively input, and a plurality of output terminals from which a first switching signal, a second switching signal and a third switching signal are respectively output.

According to an aspect of the present disclosure, a wireless communication system using a cellular network, includes: a voltage controlled oscillator configured to generate an output clock signal; a divider configured to divide the output clock signal into a first phase division signal and a second phase division signal, the first phase division signal and the second phase division signal having a constant phase difference; a sampling phase frequency detector configured to sample, based on the first phase division signal, a sampling voltage generated at a sampling node according to a reference clock signal and output, based on the second phase division signal, any one of the sampling voltage, a first supply voltage, and a second supply voltage having a lower level than the first supply voltage to a hold node; a transconductance circuit configured to output a conversion current based on a hold voltage generated at the hold node; and a loop filter configured to generate a voltage control signal based on the conversion current and output the voltage control signal to the voltage controlled oscillator.

BRIEF DESCRIPTION OF THE DRAWINGS

Embodiments of the present disclosure will be more clearly understood from the following detailed description taken in conjunction with the accompanying drawings in which.

DETAILED DESCRIPTION

Hereinafter, embodiments of the present disclosure will be described in detail with reference to the accompanying drawings.

Figure 1:
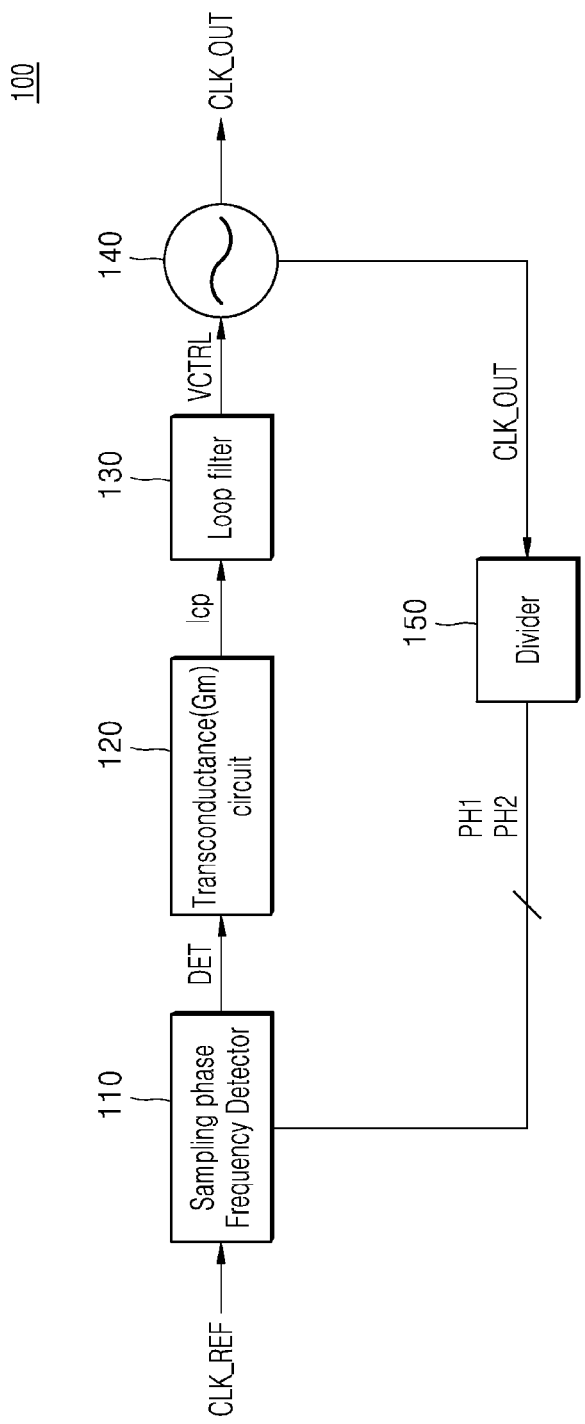
FIG. 1 is a block diagram illustrating a phase-locked loop device according to an embodiment of the present disclosure.

FIG. 1 is a block diagram illustrating a phase-locked loop device according to an embodiment of the present disclosure.

Referring to FIG. 1, a phase-locked loop device 100 may be implemented as an integrated circuit manufactured by a semiconductor process in some embodiments, and in some embodiments, may include at least one semiconductor package including an integrated circuit and a board on which the semiconductor package is mounted. The phase-locked loop device 100 may be referred to as a phase-locked loop or a phase-locked loop circuit.

The phase-locked loop device 100 may output an output clock signal CLK_OUT from a reference clock signal CLK_REF. The reference clock signal CLK_REF may vibrate at a constant frequency and may be generated from, for example, a crystal oscillator. The output clock signal CLK_OUT may have a target frequency required by the functional block. The functional block may process a signal based on the output clock signal CLK_OUT, and the signal processing speed of a functional block may depend on the frequency of the output clock signal CLK_OUT and the jitter of the output clock signal CLK_OUT may limit the high-speed operation of the functional block. Accordingly, the phase-locked loop device 100 may synchronize the reference clock signal CLK_REF with the output clock signal CLK_OUT. According to this, the phase-locked loop device 100 may generate an output clock signal CLK_OUT having reduced jitter by blocking the effect of noise that causes jitter.

The phase-locked loop device 100 may include a sampling phase frequency detector 110, a transconductance circuit 120, a loop filter 130, a voltage controlled oscillator 140, and a divider 150. For these items, and other circuits and functions described herein, structural implementation, as an example, is based on structural circuit hardware. For example, the elements of the circuits described in the application may be implemented by hardware circuit components such as resistors, inductors, capacitors, transistors, crystals, diodes, combinatorial logic gates, clocked logic gates such as flip-flops, transmission lines, hardware switches and application specific integrated circuits (ASICs). Control may be provided by a hardware processor such as a CPU executing instructions stored in a memory.

The sampling phase frequency detector 110 may receive the reference clock signal CLK_REF from the outside of the phase-locked loop device 100. The sampling phase frequency detector 110 may receive the first and second phase division signals PH1 and PH2 divided by the divider 150. The first and second phase division signals PH1 and PH2 may be referred to as feedback signals. The first and second phase division signals PH1 and PH2 may be signals for sampling a certain voltage in the sampling phase frequency detector 110 and transferring the sampled voltage. A phase difference between the first and second phase division signals PH1 and PH2 may be constant.

The sampling phase frequency detector 110 may detect a phase difference between the reference clock signal CLK_REF and the output clock signal CLK_OUT, and generate a detection signal DET corresponding to the detected phase difference. The detection signal DET, in an embodiment, may be a hold voltage described later. Alternatively, in another embodiment, the detection signal DET may include a first supply voltage (e.g., Vdd shown in FIG. 3) and a hold voltage.

In one embodiment, the sampling phase frequency detector 110 may sample a voltage generated by the reference clock signal CLK_REF at a certain node based on the first phase division signal PH1. A sampled voltage may be referred to as a sampling voltage. The sampling phase frequency detector 110 may output any one of the sampling voltage, the first supply voltage, and the second supply voltage (e.g., Vss shown in FIG. 3) as the detection signal DET based on the second phase division signal PH2. The second supply voltage may be a voltage whose level is lower than the first supply voltage. The second supply voltage may be, for example, ground.

The transconductance circuit 120 may convert a voltage corresponding to the detection signal DET into a conversion current Icp. The transconductance circuit 120 may be referred to as a Gm circuit.

In an embodiment, when the detection signal DET corresponds to the hold voltage, the transconductance circuit 120 may adjust the conversion current Icp according to a difference between the hold voltage and the reference voltage. In an example, the transconductance circuit 120 may be based on a transconductance parameter of a transistor in the transconductance circuit 120.

The loop filter 130 may generate a voltage control signal VCTRL based on the conversion current Icp and output the voltage control signal VCTRL to the voltage controlled oscillator 140.

In one embodiment, the loop filter 130 may be implemented as a low pass filter but is not limited thereto.

The voltage controlled oscillator 140 may generate an output clock signal CLK_OUT based on the voltage control signal VCTRL. The generated output clock signal CLK_OUT may be output to the outside of the phase-locked loop device 100 and may be provided to the divider 150.

The divider 150 may receive the output clock signal CLK_OUT. The divider 150 may divide the output clock signal CLK_OUT into first and second phase division signals PH1 and PH2.

The sampling phase frequency detector 110, the transconductance circuit 120, the loop filter 130, the voltage controlled oscillator 140, and the divider 150 according to an embodiment of the present disclosure may be configured as a main loop. The sampling phase frequency detector 110 may detect whether the main loop is locked (or synchronized). When the output clock signal CLK_OUT has a constant target frequency, the main loop may be referred to as fixed. Meanwhile, when the phase of the output clock signal CLK_OUT is relatively leading or lagging the phase of the reference clock signal CLK_REF, to fix the main loop, the phase of the output clock signal CLK_OUT may be changed.

The phase-locked loop device 100 according to embodiments of the present disclosure may lock the phase and frequency only with the main loop without separately including a frequency locking loop to be described later. According to this, the degree of integration may be improved, and the reliability and performance of the device may be increased.

Figure 2:
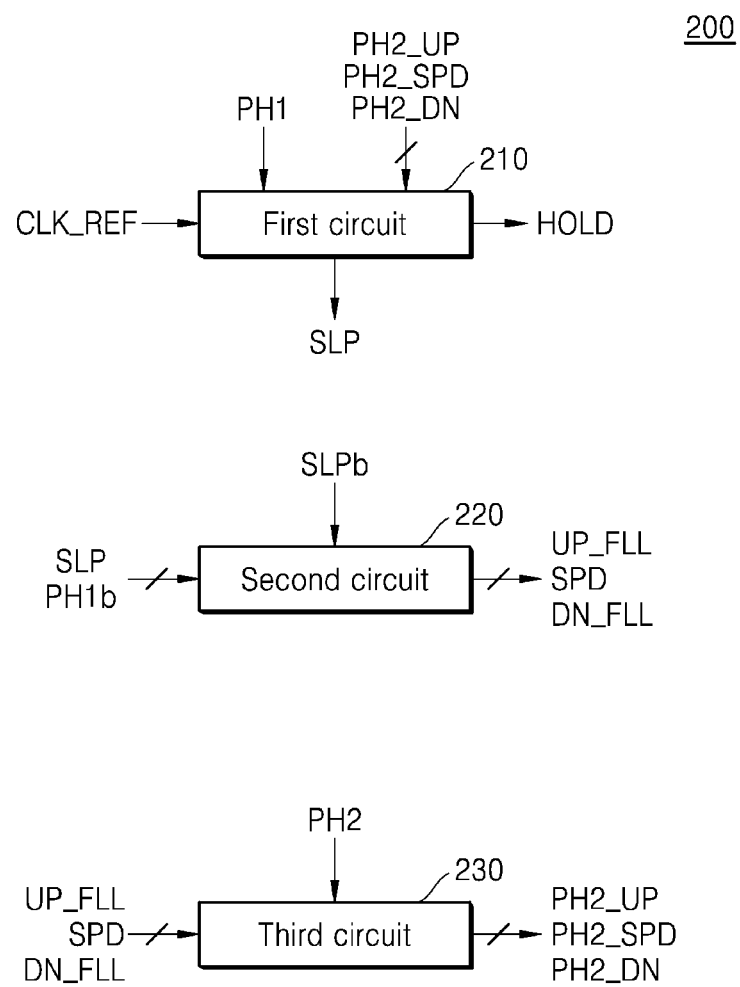
FIG. 2 is a block diagram illustrating a sampling phase frequency detector according to an embodiment of the present disclosure.

FIG. 2 is a block diagram illustrating a sampling phase frequency detector according to an embodiment of the present disclosure.

Referring to FIG. 2, a sampling phase frequency detector 200 may include a first circuit 210, a second circuit 220, and a third circuit 230.

The first circuit 210 may receive the reference clock signal CLK_REF and the first phase division signal PH1. The first circuit 210 may sample the sampling voltage SLP in response to an edge of the first phase division signal PH1. The sampling voltage SLP may be a voltage generated at a certain node according to the reference clock signal CLK_REF. The first circuit 210 may receive the first to third switching signals PH2_UP, PH2_DN, and PH2_SPD, and output a sampling voltage SLP and a hold voltage HOLD. The first to third switching signals PH2_UP, PH2_DN, and PH2_SPD may be signals for selecting any one of the first supply voltage, the second supply voltage, and the sampling voltage as the hold voltage HOLD. For example, during a section in which the first switching signal PH2_UP has a first logic level and the second and third switching signals PH2_DN and PH2_SPD have a second logic level, the first supply voltage may be output as the hold voltage HOLD. Here, the first logic level may indicate logic high, and the second logic level may indicate logic low. However, embodiments are not limited thereto. In another example, during a section in which the second switching signal PH2_DN has a first logic level and the first and third switching signals PH2_UP and PH2_SPD have a second logic level, the second supply voltage may be output as the hold voltage HOLD. In another example, during a section in which the third switching signal PH2_SPD has a first logic level and the first and second switching signals PH2_UP and PH2_DN have a second logic level, the sampling voltage SLP may be output as the hold voltage HOLD. Embodiments of the first to third switching signals PH2_UP, PH2_DN, and PH2_SPD are described later with reference to FIGS. 6 to 8B.

The second circuit 220 may receive a first inverted phase division signal PH1b, an inverted sampling voltage SLPb, and a sampling voltage SLP. The first inverted phase division signal PH1b may be a signal obtained by inverting the first phase division signal PH1. The inverted sampling voltage SLPb may be a signal obtained by inverting the sampling voltage SLP. The second circuit 220 may output first to third selection signals UP_FLL, DN_FLL, and SPD to the third circuit 230.

The first selection signal UP_FLL may be referred to as an up selection signal, the second selection signal DN_FLL may be referred to as a down selection signal, and the third selection signal SPD may be referred to as a sampling selection signal. Embodiments of the first to third selection signals UP_FLL, DN_FLL, and SPD are described later with reference to FIGS. 6 to 8B.

The third circuit 230 may receive first to third selection signals UP_FLL, DN_FLL, and SPD and a second phase division signal PH2, and output first to third switching signals PH2_UP, PH2_DN, and PH2_SPD to the first circuit 210. The first to third selection signals UP_FLL, DN_FLL, and SPD may be signals for matching the phase of any one of the first to third switching signals PH2_UP, PH2_DN, PH2_SPD to the phase of the second phase division signal PH2. For example, when the first selection signal UP_FLL has a first logic level and the second and third selection signals DN_FLL and SPD have a second logic level, a phase of the first switching signal PH2_UP may correspond to a phase of the second phase division signal PH2. In another example, when the second selection signal DN_FLL has a first logic level and the first and third selection signals UP_FLL and SPD have a second logic level, a phase of the second switching signal PH2_DN may correspond to a phase of the second phase division signal PH2. In another example, when the third selection signal SPD_FLL has a first logic level and the first and second selection signals UP_FLL and DN_FLL have a second logic level, a phase of the third switching signal PH2_SPD may correspond to a phase of the second phase division signal PH2.

The first switching signal PH2_UP may be referred to as an up switching signal, the second switching signal PH2_DN may be referred to as a down switching signal, and the third switching signal PH2_SPD may be referred to as a sampling switching signal. Embodiments of the first to third switching signals PH2_UP, PH2_DN, and PH2_SPD are described later with reference to FIGS. 6 to 8B.

Figure 3:
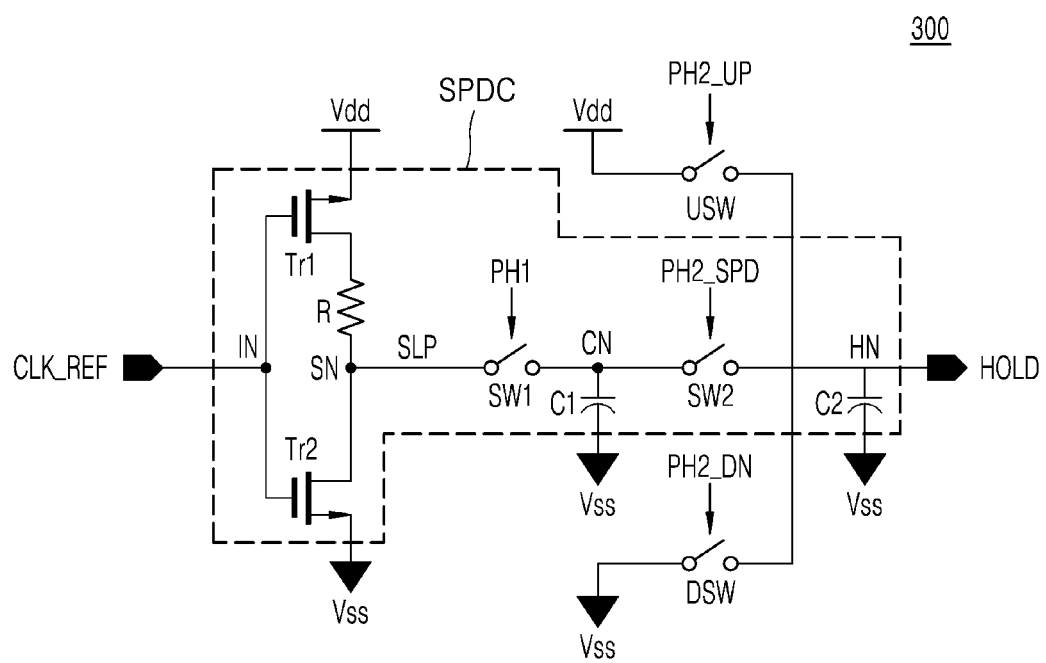
FIG. 3 is a circuit diagram illustrating a first circuit included in a sampling phase frequency detector according to an embodiment of the present disclosure.

FIG. 3 is a circuit diagram illustrating a first circuit included in a sampling phase frequency detector according to an embodiment of the present disclosure.

Referring to FIG. 3, a first circuit 300 may be implemented as an integrated circuit chip including an input terminal to which the reference clock signal CLK_REF is input and an output terminal from which the hold voltage HOLD is output. The first circuit 300 may include a sampling phase detection circuit SPDC, an up switch USW, and a down switch DSW.

The sampling phase detection circuit SPDC may be connected between the input node IN and the hold node HN. The sampling phase detection circuit SPDC may sample the sampling voltage SLP generated at the sampling node SN based on the first phase division signal PH1. Also, the sampling phase detection circuit SPDC may transmit the sampling voltage SLP as the hold voltage HOLD to the hold node HN based on the third switching signal PH2_SPD. The sampling phase detection circuit SPDC may include a first transistor Tr1, a second transistor Tr2, a resistor R, a first switch SW1, a first capacitor C1, a second switch SW2, a second switch SW2, and a second capacitor C2.

The first transistor Tr1 may transmit the first supply voltage Vdd to the sampling node SN in response to the reference clock signal CLK_REF. The first transistor Tr1 may be connected between a node to which the first supply voltage Vdd is applied and a sampling node SN where the sampling voltage SLP is generated. Specifically, the first electrode of the first transistor Tr1 may be connected to a node to which the first supply voltage Vdd is applied, the second electrode of the first transistor Tr1 may be connected to the first terminal of the resistor R, and the gate electrode of the first transistor Tr1 may be connected to the input node IN to which the reference clock signal CLK_REF is input. When the first transistor Tr1 is turned on, the first supply voltage Vdd is transferred to the sampling node SN, and the level of the sampling voltage SLP may increase.

The second transistor Tr2 may transmit the second supply voltage Vss to the sampling node SN in response to the reference clock signal CLK_REF. The second transistor Tr2 may be connected between a node to which the second supply voltage Vss is applied and the sampling node SN. Specifically, the first electrode of the second transistor Tr2 may be connected to a node to which the second supply voltage Vss is applied, a second electrode of the second transistor Tr2 may be connected to the sampling node SN, and a gate electrode of the second transistor Tr2 may be connected to the input node IN. When the second transistor Tr2 is turned on, the second supply voltage Vss is transferred to the sampling node SN, and the level of the sampling voltage SLP may be lowered.

In one embodiment, the first transistor Tr1 may be implemented with PMOS and the second transistor Tr2 may be implemented with NMOS, but embodiments are not limited thereto. The first electrode of the first transistor Tr1 implemented with PMOS and the first electrode of the second transistor Tr2 implemented with NMOS may be sources, and the second electrode of the first transistor Tr1 implemented with PMOS and the second electrode of the second transistor Tr2 implemented with NMOS may be drains. In one embodiment, while the reference clock signal CLK_REF has a first logic level, the first transistor Tr1 implemented with PMOS may be turned off and the second transistor Tr2 implemented with NMOS may be turned on. Alternatively, while the reference clock signal CLK_REF has the second logic level, the first transistor Tr1 implemented with PMOS may be turned on and the second transistor Tr2 implemented with NMOS may be turned off.

A first terminal of the resistor R may be connected to the second electrode of the first transistor Tr1, and a second terminal of the resistor R may be connected to the sampling node SN.

The first switch SW1 is connected between the sampling node SN and the charge node CN, and may connect the sampling node SN to the charge node CN in response to the first phase division signal PH1. In one embodiment, when the first phase division signal PH1 has a first logic level, the first switch SW1 is turned on and the sampling voltage SLP is applied to the charge node CN.

The first capacitor C1 may store a charge corresponding to a difference between the voltage generated at the charge node CN and the second supply voltage Vss. The first capacitor C1 may be connected between a node to which the second supply voltage is applied and the charge node CN. Specifically, a first terminal of the first capacitor C1 may be connected to the charge node CN, and a second terminal of the first capacitor C1 may be connected to a node to which the second supply voltage is applied.

The second switch SW2 is connected between the charge node CN and the hold node HN, and may connect the charge node CN to the hold node HN in response to the third switching signal PH2_SPD. In one embodiment, when the third switching signal PH2_SPD has the first logic level, the second switch SW2 is turned on, and a voltage generated at the charge node CN (or a voltage corresponding to the charge stored in the first capacitor C1) may be applied to the hold node HN.

In one embodiment, each of the first switch SW1 and the second switch SW2 may be implemented as an NMOS transistor, but is not limited thereto.

The second capacitor C2 may store a charge corresponding to a difference between a voltage generated at the hold node HN (e.g., the hold voltage HOLD) and the second supply voltage Vss. The second capacitor C2 may be connected between a node to which the second supply voltage is applied and the hold node HN. Specifically, a first terminal of the second capacitor C2 may be connected to the hold node HN, and a second terminal of the second capacitor C2 may be connected to a node to which the second supply voltage is applied.

The up switch USW may transmit the first supply voltage Vdd as the hold voltage HOLD to the hold node HN based on the first switching signal PH2_UP. The up switch USW is connected between the node to which the first supply voltage Vdd is applied and the hold node HN to connect a node to which the first supply voltage Vdd is applied to the hold node HN in response to the first switching signal PH2_UP. In one embodiment, when the first switching signal PH2_UP has a first logic level, the up switch USW is turned on and the first supply voltage Vdd is applied to the hold node HN. In one embodiment, the up switch USW may be implemented as an NMOS transistor, but is not limited thereto.

The down switch DSW may transmit the second supply voltage Vss as the hold voltage HOLD to the hold node HN based on the second switching signal PH2_DN. The down switch DSW is connected between the node to which the second supply voltage Vss is applied and the hold node HN to connect a node to which the second supply voltage Vss is applied to the hold node HN in response to the second switching signal PH2_DN. In an embodiment, when the second switching signal PH2_DN has the first logic level, the down switch DSW is turned on and the second supply voltage Vss is applied to the hold node HN. In one embodiment, the down switch DSW may be implemented with an NMOS transistor, but is not limited thereto.

Figure 4:
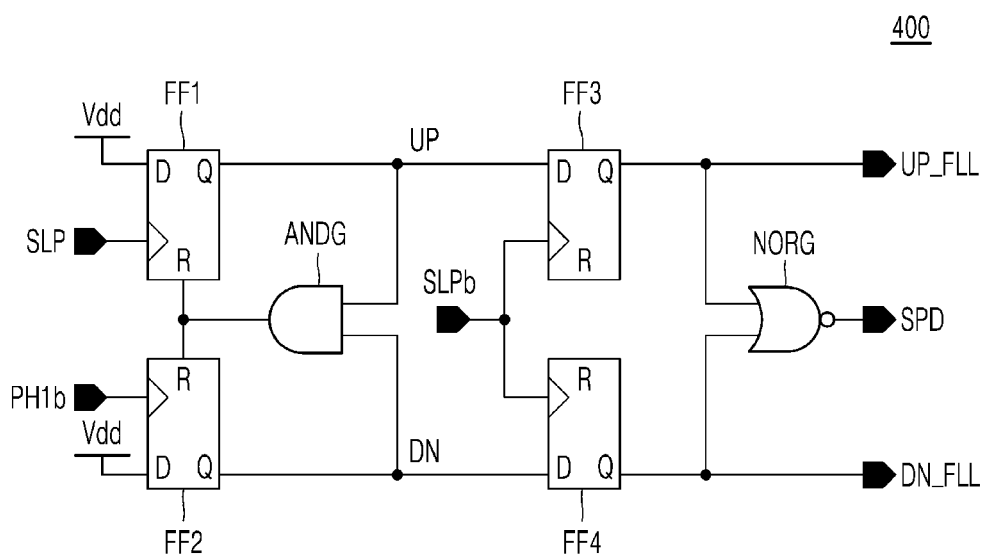
FIG. 4 is a circuit diagram illustrating a second circuit included in a sampling phase frequency detector according to an embodiment of the present disclosure.

FIG. 4 is a circuit diagram illustrating a second circuit included in a sampling phase frequency detector according to an embodiment of the present disclosure.

Referring to FIG. 4, a second circuit 400 may be implemented as an integrated circuit chip including an input terminal to which the sampling voltage SLP is input, an input terminal to which the first inverted phase division signal PH1b is input, an input terminal to which the inverted sampling voltage SLPb is input, and terminals from which the first to third selection signals UP_FLL, DN_FLL, and SPD are output. The second circuit 400 may include first to fourth flip-flops FF1, FF2, FF3, and FF4, an AND gate ANDG, and a negative OR gate NORG.

The first flip-flop FF1 may include a clock terminal to which the sampling voltage SLP is input, an input terminal to which the first supply voltage Vdd is input, and an output terminal from which the first latch signal UP is output. The first flip-flop FF1 may latch the first supply voltage Vdd in response to the sampling voltage SLP and output a first latch signal UP. In one embodiment, the first flip-flop FF1 may output a first latch signal UP having a level (e.g., a first logic level) of the first supply voltage Vdd in response to the rising edge of the sampling voltage SLP. The first latch signal UP may be referred to as an up latch signal.

The second flip-flop FF2 may include a clock terminal to which the first inverted phase division signal PH1b is input, an input terminal to which the first supply voltage Vdd is input, and an output terminal from which the second latch signal DN is output. The second flip-flop FF2 may latch the first supply voltage Vdd in response to the first inverted phase division signal PH1b and output a second latch signal DN. In an embodiment, the second flip-flop FF2 may output the second latch signal DN having a level (e.g., a first logic level) of the first supply voltage Vdd in response to the rising edge of the first inverted phase division signal PH1b. The second latch signal DN may be referred to as a down latch signal.

The logical AND gate ANDG may include input terminals to which the first latch signal UP and the second latch signal DN are input, and output terminals connected to reset terminals of the first flip-flop FF1 and the second flip-flop FF2, respectively. The AND gate ANDG may perform an AND operation on the first latch signal UP and the second latch signal DN. Also, the AND gate ANDG may transfer an output signal indicating a result of the AND operation to the reset terminals of the first flip-flop FF1 and the second flip-flop FF2, respectively. In one embodiment, when both the first latch signal UP and the second latch signal DN have a first logic level (e.g., logic high), the AND gate ANDG may output an output signal having a first logic level to reset terminals of the first flip-flop FF1 and the second flip-flop FF2, respectively. At this time, the first flip-flop FF1 and the second flip-flop FF2 may be reset.

The third flip-flop FF3 may include a clock terminal to which the inverted sampling voltage SLPb is input, an input terminal to which the first latch signal UP is input, and an output terminal from which the first selection signal UP_FLL is output. The third flip-flop FF3 may latch the first latch signal UP in response to the inverted sampling voltage SLPb and output the latched signal as the first selection signal UP_FLL. In an embodiment, the third flip-flop FF3 may latch the first latch signal UP in response to a rising edge of the inverted sampling voltage SLPb.

The fourth flip-flop FF4 may include a clock terminal to which the inverted sampling voltage SLPb is input, an input terminal to which the second latch signal DN is input, and an output terminal from which the second selection signal DN_FLL is output. The fourth flip-flop FF4 may latch the second latch signal DN in response to the inverted sampling voltage SLPb and output the latched signal as a second selection signal DN_FLL. In an embodiment, the fourth flip-flop FF4 may latch the second latch signal DN in response to a rising edge of the inverted sampling voltage SLPb.

The negative OR gate NORG may include input terminals to which the first selection signal UP_FLL and the second selection signal DN_FLL are input, and an output terminal from which the third selection signal SPD is output. The negative OR gate NORG may perform a negative OR operation on the first selection signal UP_FLL and the second selection signal DN_FLL. Also, the negative OR gate NORG may output an output signal indicating a result of the negative OR operation as a third selection signal SPD. In one embodiment, when both the first selection signal UP_FLL and the second selection signal DN_FLL have a second logic level (e.g., logical low), the negative OR gate NORG outputs a third selection signal SPD having a first logic level, and when any one of the first selection signal UP_FLL and the second selection signal DN_FLL has the first logic level, the negative OR gate NORG may output a third selection signal SPD having a second logic level.

Figure 5:
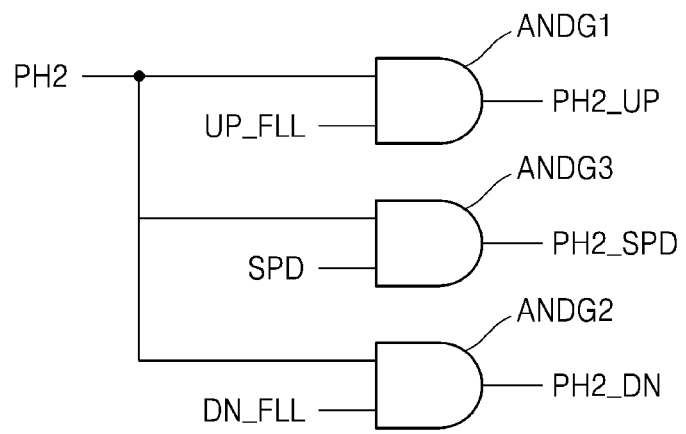
FIG. 5 is a circuit diagram illustrating a third circuit included in a sampling phase frequency detector according to an embodiment of the present disclosure.

FIG. 5 is a circuit diagram illustrating a third circuit included in a sampling phase frequency detector according to an embodiment of the present disclosure.

Referring to FIG. 5, a third circuit 500 may be implemented as an integrated circuit chip including at least one input terminal to which the second phase division signal PH2 is input, input terminals to which the first to third selection signals UP_FLL, DN_FLL, and SPD are input, and output terminals from which the first to third switching signals PH2_UP, PH2_DN, and PH2_SPD are output. The third circuit 500 may include first to third AND gates ANDG1, ANDG2, and ANDG3.

The first AND gate ANDG1 may include input terminals to which the second phase division signal PH2 and the first selection signal UP_FLL are input, and an output terminal from which the first switching signal PH2_UP is output. The first AND gate ANDG1 may perform an AND operation on the second phase division signal PH2 and the first selection signal UP_FLL to output the first switching signal PH2_UP. In one embodiment, when the first selection signal UP_FLL is the first logic level, the first AND gate ANDG1 may output the same first switching signal PH2_UP as the second phase division signal PH2. In another embodiment, when the first selection signal UP_FLL is the second logic level, the first AND gate ANDG1 may output a first switching signal PH2_UP having a second logic level.

The second AND gate ANDG2 may include input terminals to which the second phase division signal PH2 and the second selection signal DN_FLL are input, and an output terminal from which the second switching signal PH2_DN is output. The second AND gate ANDG2 may perform an AND operation on the second phase division signal PH2 and the second selection signal DN_FLL to output the second switching signal PH2_DN. In one embodiment, when the second selection signal DN_FLL has the first logic level, the second AND gate ANDG2 may output the second switching signal PH2_DN equal to the second phase division signal PH2. In another embodiment, when the second selection signal DN_FLL is the second logic level, the second AND gate ANDG2 may output a second switching signal PH2_DN having a second logic level.

The third AND gate ANDG3 may include input terminals to which the second phase division signal PH2 and the third selection signal SPD are input, and an output terminal from which the third switching signal PH2_SPD is output. The third AND gate ANDG3 may perform an AND operation on the second phase division signal PH2 and the third selection signal SPD to output a third switching signal PH2_SPD. In one embodiment, when the third selection signal SPD is the first logic level, the third AND gate ANDG3 may output the third switching signal PH2_SPD equal to the second phase division signal PH2. In another embodiment, when the third selection signal SPD has the second logic level, the third AND gate ANDG3 may output the third switching signal PH2_SPD having the second logic level.

In FIG. 5, as mentioned above, UP_FLL, DN_FLL and SPD correspond to a first selection signal, a second selection signal and a third selection signal. One of these is active and the other two are inactive. See, for example, FIG. 6. That is, one of these is an active selection signal among the first selection signal, the second selection signal and the third selection signal at an active logic level, and the other two among the first selection signal, the second selection signal and the third selection signal have an inactive logic level.

In the example of FIG. 5, the three AND gates perform a multiplexing function determining how the signal PH2 will be routed to the switches of FIG. 3. The switches USW, SW2 and DSW determine a signal to be applied to the hold node HN (see FIG. 3). Thus, the active selection signal (determined by the circuit in FIG. 5) routes the second phase division signal (PH2) to be an active switching signal among the first switching signal, the second switching signal and the third switching signal. The active switching signal is configured to close a switch (one of the switches USW, SW2, DSW) connected to the hold node HN.

Figure 6:
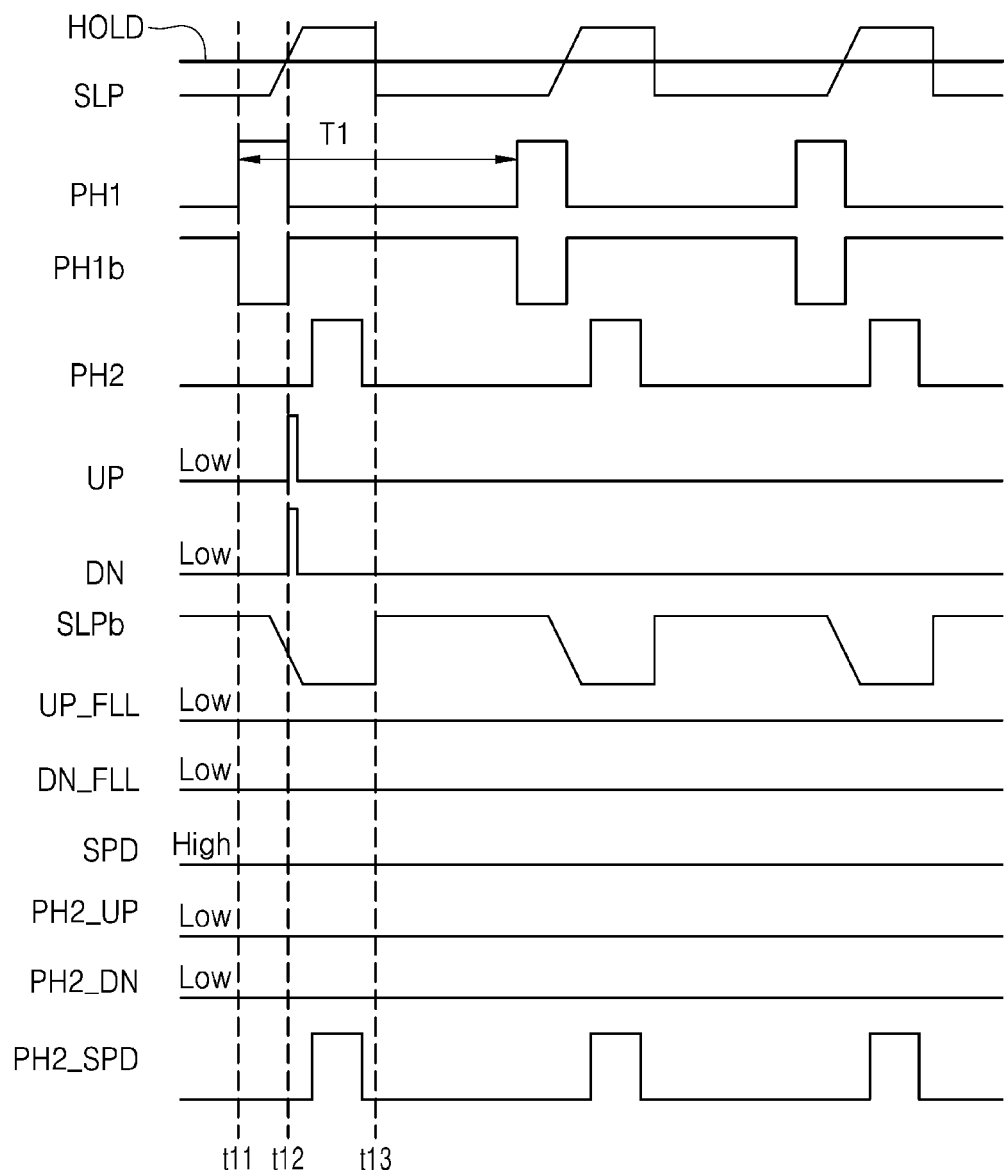
FIG. 6 is a timing diagram of signals generated in a phase locked state according to embodiments of the present disclosure.

FIG. 6 is a timing diagram of signals generated in a phase locked state according to embodiments of the present disclosure.

Referring to FIGS. 3 to 6, the level of the sampling voltage SLP may increase to reach a certain level while the first transistor Tr1 is turned on. Alternatively, the level of the sampling voltage SLP may decrease while the second transistor Tr2 is turned on. As such, the level of the sampling voltage SLP may increase or decrease for each cycle of the reference clock signal CLK_REF. The period of the reference clock signal CLK_REF may be, for example, 2π but is not limited thereto.

The phase difference between the first and second phase division signals PH1 and PH2 shown in FIG. 6 is constant, and may be the same as the phase difference between the first and second phase division signals PH1 and PH2 shown in FIGS. 7A to 8B. The period of each of the first and second phase division signals PH1 and PH2 shown in FIG. 6 may be T1. T1 may be equal to the period of the reference clock signal CLK_REF.

At the first time point t11, the first phase division signal PH1 may change from the second logic level to the first logic level. It is assumed that the first logic level is logic high and the second logic level is logic low. At this time, the first switch SW1 may be turned on. Meanwhile, the timing of changing from the first logic level to the second logic level may be referred to as a falling edge, and the timing of changing from the second logic level to the first logic level may be referred to as a rising edge.

At the second time point t12, the first phase division signal PH1 may be changed from the first logic level to the second logic level. Since the first switch SW1 is turned off in response to the falling edge of the first phase division signal PH1, the sampling voltage SLP at the falling edge of the first phase division signal PH1 may be sampled. In this case, the level of the sampling voltage SLP may correspond to the level of the reference voltage, e.g., half (Vdd/2) of the first supply voltage Vdd. On the other hand, in response to the rising edge of each of the first inverted phase division signal PH1b and the sampling voltage SLP, the first latch signal UP and the second latch signal DN may temporarily have the level of the first supply voltage Vdd, but may be reset by the output of the AND gate connected to the reset terminals of the first flip-flop FF1 and the second flip-flop FF2. Levels of the reset first latch signal UP and the second latch signal DN may be a second logic level.

At the third time point t13, the inverted sampling voltage SLPb may change from a second logic level to a first logic level. The first latch signal UP and the second latch signal DN may be latched in response to the rising edge of the inverted sampling voltage SLPb. In this case, the first and second selection signals UP_FLL and DN_FLL may have a second logic level, and the third selection signal SPD may have a first logic level. The first and second switching signals PH2_UP and PH2_DN may have a second logic level, and the third switching signal PH2_SPD may have the same phase as the second phase division signal PH2. While the third switching signal PH2_SPD is at the first logic level, the sampling voltage SLP applied to the charge node CN may be transferred to the hold node HN as the hold voltage HOLD.

As shown in FIG. 6, when the phase difference between the phase of the output clock signal CLK_OUT and the phase of the reference clock signal CLK_REF is 0, the sampling voltage SLP sampled in response to the falling edge of the first phase division signal PH1 may be equal to the level of the reference voltage (e.g., half of the first supply voltage Vdd). That is, when the level of the sampling voltage SLP corresponds to half of the level of the first supply voltage at the edge where the first phase division signal PH1 changes from the first logic level to the second logic level, the third switching signal PH2_SPD may correspond to the second phase division signal PH2. Accordingly, the level of the hold voltage HOLD may be the same as that of the reference voltage.

Figure 7A:
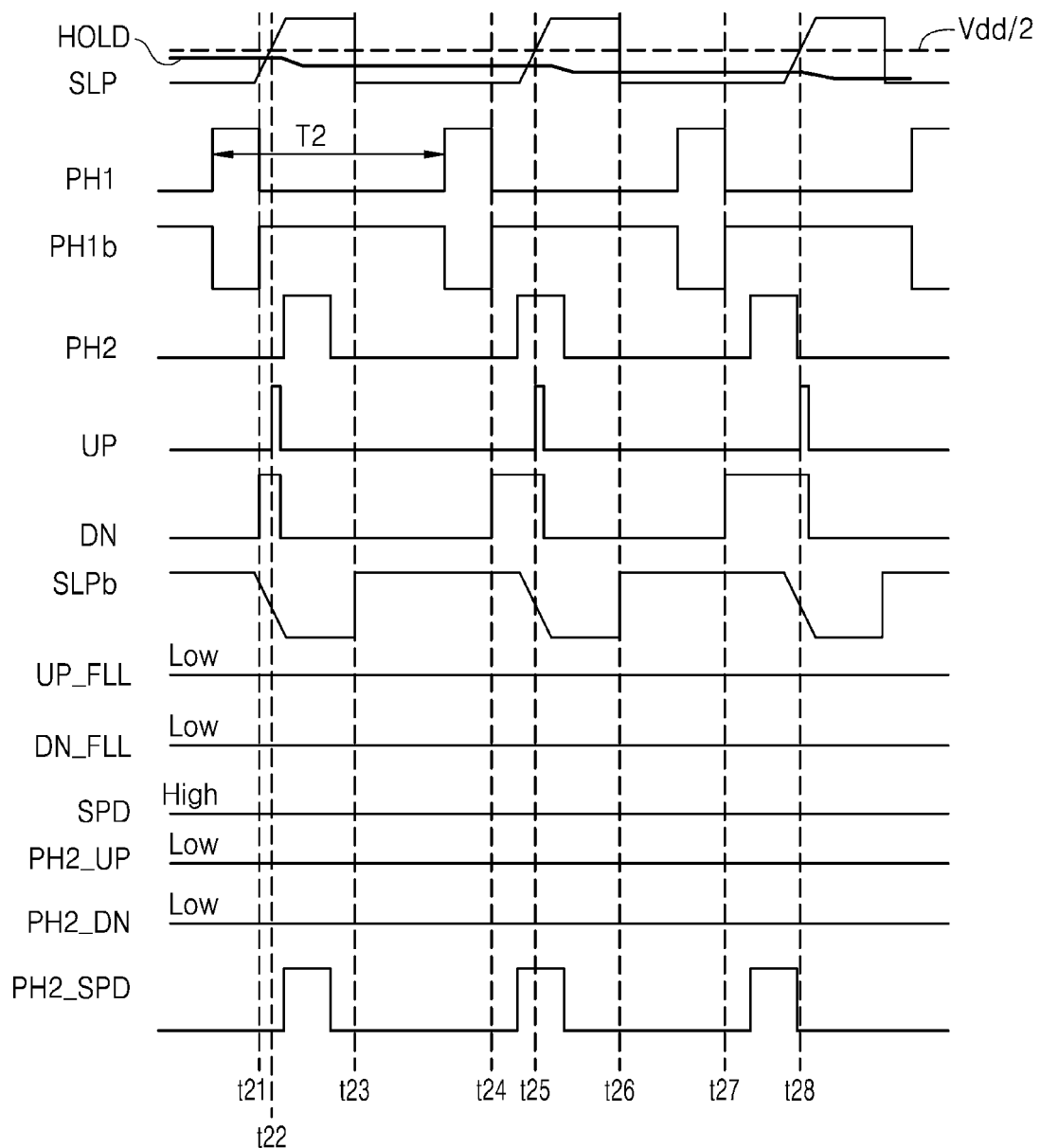
FIGS. 7A and 7B are timing diagrams of signals generated in a phase lead state according to embodiments of the present disclosure.
Figure 7B:
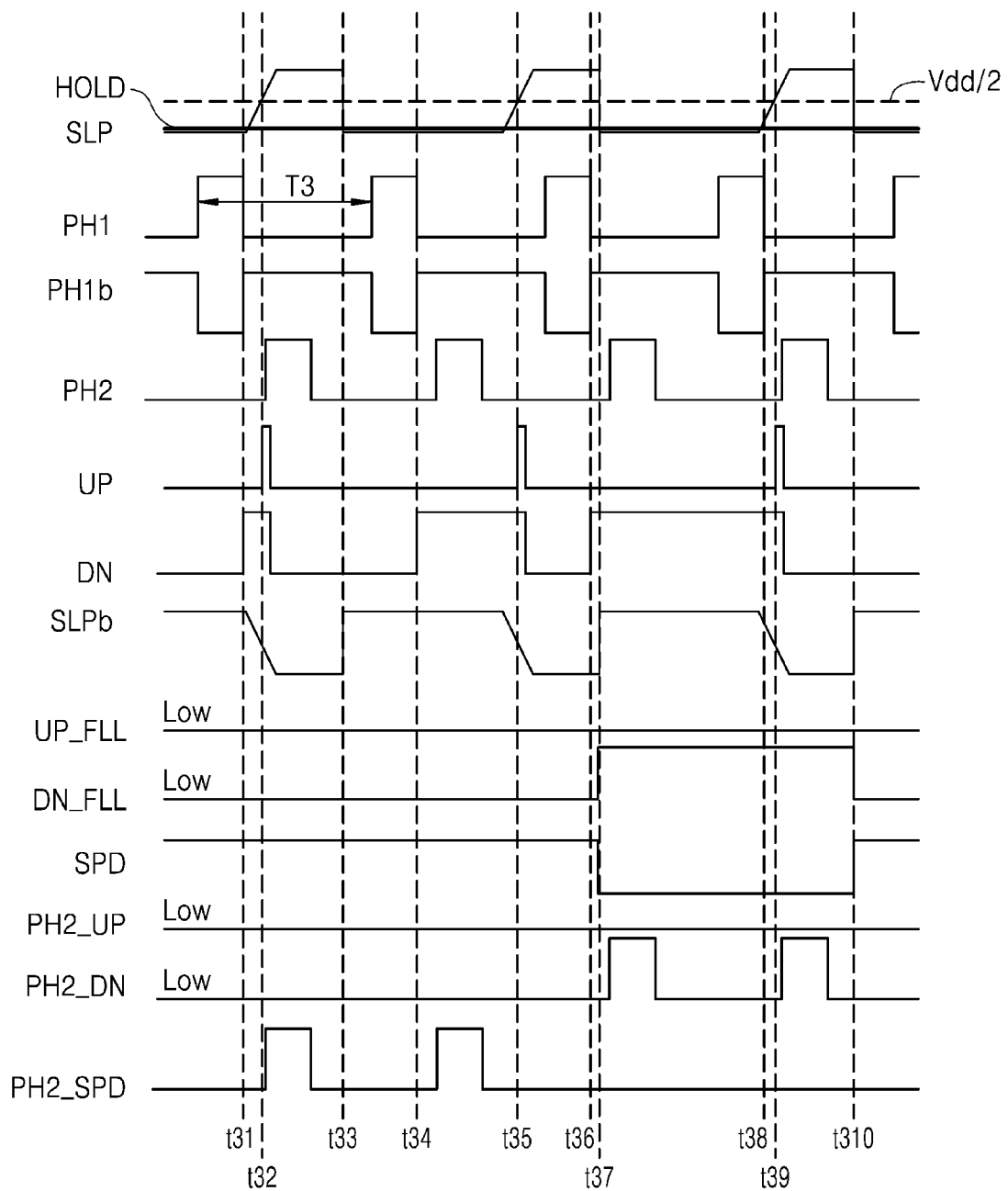

FIGS. 7A and 7B are timing diagrams of signals generated in a phase lead state according to embodiments of the present disclosure. Specifically, FIG. 7A is a timing diagram of signals generated when the phase difference between the output clock signal CLK_OUT and the reference clock signal CLK_REF is less than or equal to a half cycle (e.g., x) of the reference clock signal CLK_REF, and FIG. 7B is a timing diagram of signals generated when the phase difference between the output clock signal CLK_OUT and the reference clock signal CLK_REF is greater than a half period (e.g., x) of the reference clock signal CLK_REF.

Referring to FIG. 7A, when the phase of the output clock signal CLK_OUT is relatively ahead of the phase of the reference clock signal CLK_REF, a time point at which the sampling voltage SLP is sampled at the falling edge of the first phase division signal PH1 may be relatively faster than that shown in FIG. 6. For example, the period of each of the first and second phase division signals PH1 and PH2 shown in FIG. 7A may be T2 that is smaller than T1 shown in FIG. 6.

At the first time point t21, the level of the sampling voltage SLP sampled in response to the falling edge of the first phase division signal PH1 may be lower than half (Vdd/2) of the first supply voltage Vdd. In response to the rising edge of the first inverted phase division signal PH1b, the first supply voltage Vdd is latched, and at this time, the second latch signal DN may have a first logic level.

At the second time point t22, the first supply voltage Vdd is latched in response to the rising edge of the sampling voltage SLP, and at this time, the first latch signal UP may have a first logic level. When the first latch signal UP and the second latch signal DN have the first logic level, the first flip-flop FF1 and the second flip-flop FF2 are reset, so that the first latch signal UP and the second latch signal DN may all have the second logic level.

At the third time point t23, in response to the falling edge of the sampling voltage SLP, that is, the rising edge of the inverted sampling voltage SLPb, the first latch signal UP and the second latch signal DN having the second logic level are latched, so that the first and second selection signals UP_FLL and DN_FLL may have the second logic level, and the third selection signal SPD may have a first logic level.

During the section where the third switching signal PH2_SPD is at the first logic level, the hold voltage HOLD may decrease according to the reduced sampling voltage SLP.

In response to the falling edge of the first phase division signal PH1 at the fourth time point t24, the level of the sampled sampling voltage SLP may be lower than the level of the sampling voltage SLP sampled at the first time point t21. In response to the rising edge of the first inverted phase division signal PH1b, the second latch signal DN may have a first logic level.

At the fifth time point t25, after the level of the first latch signal UP becomes the first logic level in response to the rising edge of the sampling voltage SLP, the first flip-flop FF1 and the second flip-flop FF2 are reset so that the levels of the first latch signal UP and the second latch signal DN both become the second logic level.

At the sixth time point t26, in response to the rising edge of the inverted sampling voltage SLPb, the first and second selection signals UP_FLL and DN_FLL may have a second logic level, and the third selection signal SPD may have a first logic level.

During a section in which the third switching signal PH2_SPD is at the first logic level, the hold voltage HOLD may be further reduced by the sampling voltage SLP.

At the seventh time point t27, the sampling voltage SLP may be sampled in response to the falling edge of the first phase division signal PH1, and in response to the rising edge of the first inverted phase division signal PH1b, the second latch signal DN may have a first logic level.

At the eighth time point t28, after the level of the first latch signal UP becomes the first logic level in response to the rising edge of the sampling voltage SLP, the first flip-flop FF1 and the second flip-flop FF2 are reset so that the levels of the first latch signal UP and the second latch signal DN both become the second logic level.

The first and second switching signals PH2_UP and PH2_DN may have a second logic level, and the third switching signal PH2_SPD may have the same phase as the second phase division signal PH2.

When the phase of the output clock signal CLK_OUT is relatively ahead of the phase of the reference clock signal CLK_REF, the length of the section in which the second latch signal DN has the first logic level may increase as the cycle of the signals is repeated.

As the sampling voltage SLP decreases, the hold voltage HOLD may gradually decrease. When the hold voltage HOLD is less than half (Vdd/2) of the first supply voltage Vdd, a feedback control operation described later may be performed.

Meanwhile, referring to FIG. 7B, a phase difference between the output clock signal CLK_OUT and the reference clock signal CLK_REF may be larger than a half cycle of the reference clock signal CLK_REF. For example, the period of each of the first and second phase division signals PH1 and PH2 shown in FIG. 7B may be T3 that is less than T2 shown in FIG. 7A.

Timings of signals generated from the first time point t31 to the fifth time point t35 shown in FIG. 7B are similar to those described above with reference to FIG. 7A.

In the period from the first time point t31 to before the sixth time point t36, since the first and second selection signals UP_FLL and DN_FLL have a second logic level and the third selection signal SPD has a first logic level, the first and second switching signals PH2_UP and PH2_DN may have a second logic level, and third switching signal PH2_SPD may be the same as the second phase division signal PH2.

At the sixth time point t36, the level of the sampling voltage SLP sampled in response to the falling edge of the first phase division signal PH1 may be higher than half (Vdd/2) of the first supply voltage Vdd. In response to the rising edge of the first inverted phase division signal PH1b, the second latch signal DN may have a first logic level.

At the seventh time point t37, in response to the rising edge of the inverted sampling voltage SLPb, the first latch signal UP having the second logic level is latched, so that the first selection signal UP_FLL may have the second logic level. Meanwhile, in response to the rising edge of the inverted sampling voltage SLPb, the second latch signal DN having the first logic level is latched, so that the level of the second selection signal DN_FLL may be changed from the second logic level to the first logic level. In addition, the level of the third selection signal SPD may be changed from the first logic level to the second logic level.

At the eighth time point t38, the level of the sampling voltage SLP sampled in response to the falling edge of the first phase division signal PH1 may be lower than half (Vdd/2) of the first supply voltage Vdd. After the level of the first latch signal UP changes from the second logic level to the first logic level at the ninth time point t39, levels of the first latch signal UP and the second latch signal DN may be changed from a first logic level to a second logic level.

The logic levels of the first to third selection signals UP_FLL, DN_FLL, and SPD are maintained until the rising edge of the inverted sampling voltage SLPb occurs. In the period from the first time point t31 to before the sixth time point t36, since the first and second selection signals UP_FLL and DN_FLL have a second logic level and the third selection signal SPD has a first logic level, the first and second switching signals PH2_UP and PH2_DN may have a second logic level, and third switching signal PH2_SPD may be the same as the second phase division signal PH2.

Even when the phase difference between the output clock signal CLK_OUT and the reference clock signal CLK_REF is greater than a half cycle of the reference clock signal CLK_REF, it may be predicted that the hold voltage HOLD is less than the reference voltage (e.g., half (Vdd/2) of the first supply voltage Vdd).

As described above, even if the phase difference between the output clock signal CLK_OUT and the reference clock signal CLK_REF is greater than a half cycle of the reference clock signal CLK_REF, the frequency of the output clock signal CLK_OUT may be set as a target frequency by tracking the frequency of the output clock signal CLK_OUT.

Figure 8A:
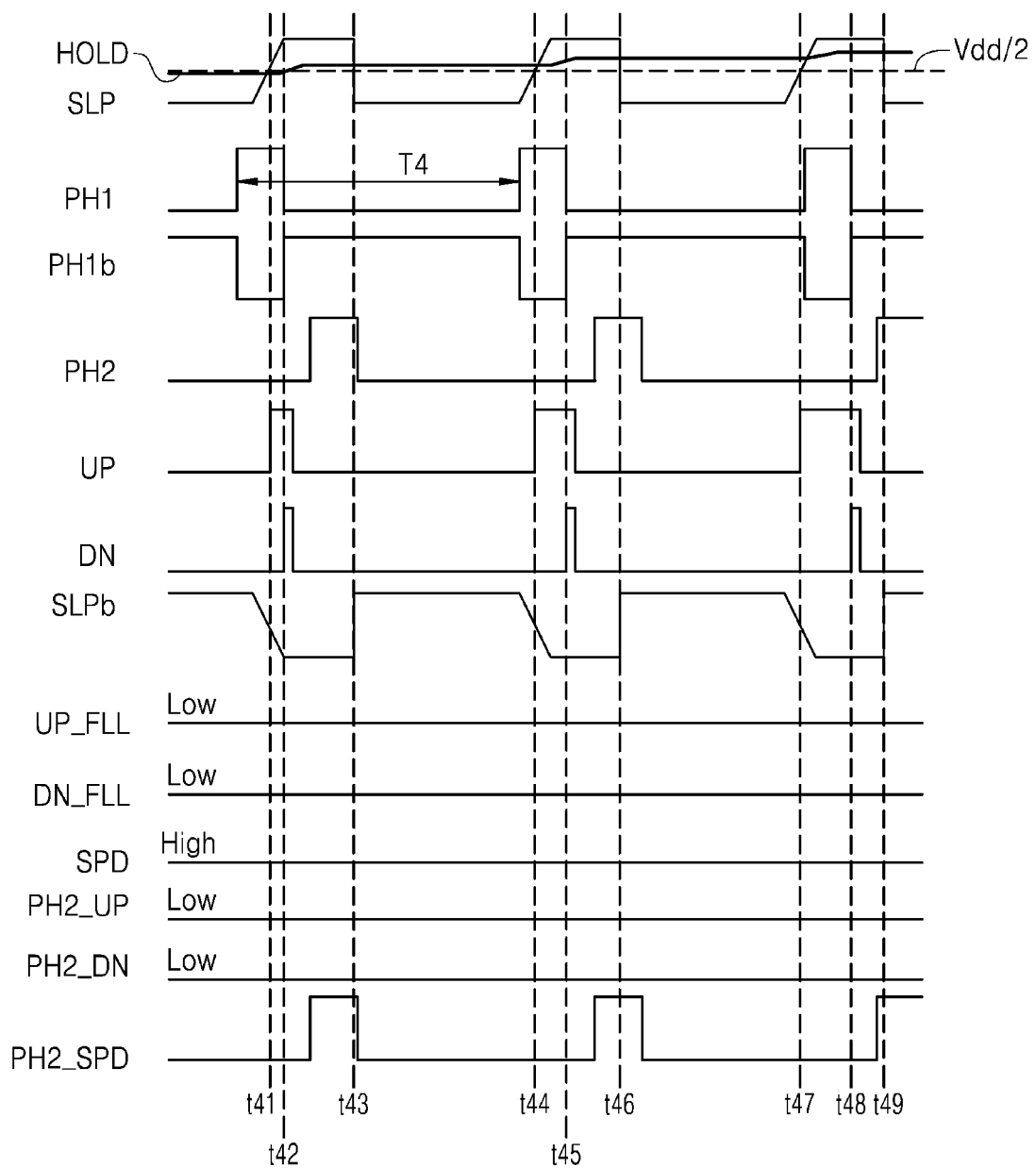
FIGS. 8A and 8B are timing diagrams of signals generated in a phase lag state according to embodiments of the present disclosure.
Figure 8B:
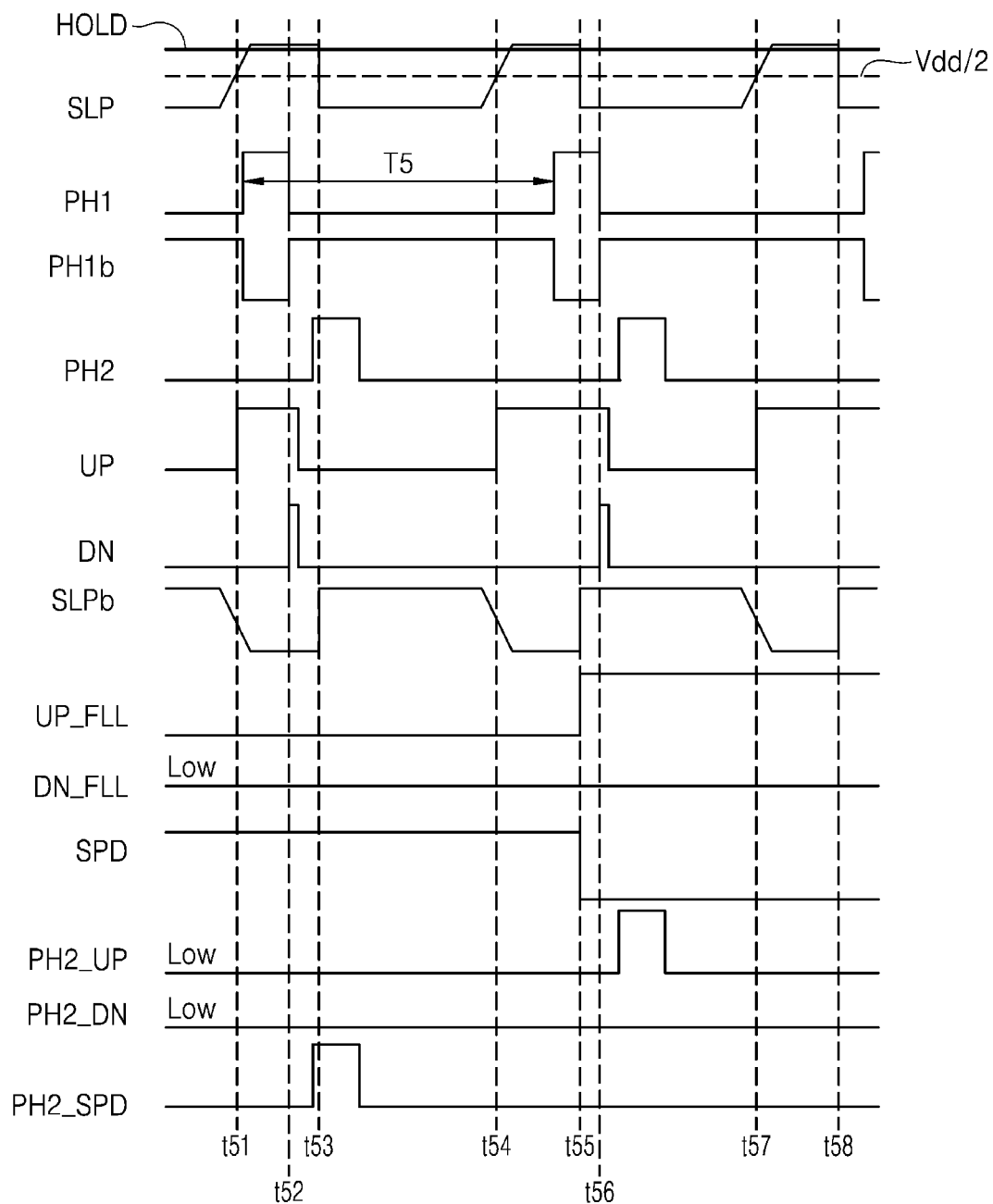

FIGS. 8A and 8B are timing diagrams of signals generated in a phase lag state according to embodiments of the present disclosure. Specifically, FIG. 8A is a timing diagram of signals generated when the phase difference between the output clock signal CLK_OUT and the reference clock signal CLK_REF is less than or equal to a half cycle (e.g., T) of the reference clock signal CLK_REF, and FIG. 8B is a timing diagram of signals generated when the phase difference between the output clock signal CLK_OUT and the reference clock signal CLK_REF is greater than a half period (e.g., It) of the reference clock signal CLK_REF.

Referring to FIG. 8A, when the phase of the output clock signal CLK_OUT is relatively behind the phase of the reference clock signal CLK_REF, a time point at which the sampling voltage SLP is sampled at the falling edge of the first phase division signal PH1 may be relatively delayed compared to that shown in FIG. 6. For example, the period of each of the first and second phase division signals PH1 and PH2 shown in FIG. 8A may be T4 that is greater than T1 shown in FIG. 6.

At the first time point t41, in response to a rising edge of the sampling voltage SLP, the first latch signal UP may have a first logic level.

At the second time point t42, the level of the sampling voltage SLP sampled in response to the falling edge of the first phase division signal PH1 may be higher than half (Vdd/2) of the first supply voltage Vdd. In response to the rising edge of the first inverted phase division signal PH1b, the second latch signal DN may have a first logic level. When the first latch signal UP and the second latch signal DN have the first logic level, the first flip-flop FF1 and the second flip-flop FF2 are reset, so that the first latch signal UP and the second latch signal DN may all have the second logic level.

At the third time point t43, in response to the rising edge of the inverted sampling voltage SLPb, the first latch signal UP and the second latch signal DN having the second logic level may be latched. In this case, the first and second selection signals UP_FLL and DN_FLL may have a second logic level, and the third selection signal SPD may have a first logic level.

During the section where the third switching signal PH2_SPD is at the first logic level, the hold voltage HOLD may increase according to the increased sampling voltage SLP.

At the fourth time point t44, the level of the first latch signal UP may become a first logic level in response to a rising edge of the sampling voltage SLP.

At the fifth time point t45, the level of the sampling voltage SLP sampled in response to the falling edge of the first phase division signal PH1 may be higher than half (Vdd/2) of the first supply voltage Vdd. In response to the rising edge of the first inverted phase division signal PH1b, the second latch signal DN may have a first logic level. In this case, the first flip-flop FF1 and the second flip-flop FF2 are reset, so that the levels of the first latch signal UP and the second latch signal DN both become the second logic level.

At the sixth time point t46, in response to the rising edge of the inverted sampling voltage SLPb, the first and second selection signals UP_FLL and DN_FLL may have a second logic level, and the third selection signal SPD may have a first logic level.

During a section in which the third switching signal PH2_SPD is at the first logic level, the hold voltage HOLD may be further increased by the sampling voltage SLP.

At the seventh time point t47, the level of the first latch signal UP may become a first logic level in response to a rising edge of the sampling voltage SLP.

At the eighth time point t48, the sampling voltage SLP may be sampled in response to the falling edge of the first phase division signal PH1. In response to the rising edge of the first inverted phase division signal PH1b, after the level of the second latch signal DN is changed from the second logic level to the first logic level, the first flip-flop FF1 and the second flip-flop FF2 are reset so that the levels of the first latch signal UP and the second latch signal DN both become the second logic level.

The first and second switching signals PH2_UP and PH2_DN may have a second logic level, and the third switching signal PH2_SPD may have the same phase as the second phase division signal PH2.

When the phase of the output clock signal CLK_OUT is relatively behind of the phase of the reference clock signal CLK_REF, the length of the section in which the level of the first latch signal UP is the first logic level may increase as the cycle of signals is repeated.

Meanwhile, referring to FIG. 8B, a phase difference between the output clock signal CLK_OUT and the reference clock signal CLK_REF may be larger than a half cycle of the reference clock signal CLK_REF. The period of each of the first and second phase division signals PH1 and PH2 shown in FIG. 8B may be T5 that is greater than T4 shown in FIG. 8A.

Timings of signals generated from the first time point t51 to the fourth time point t54 shown in FIG. 8B are similar to those described above with reference to FIG. 8A. For example, time point t52 in FIG. 8B is similar to time point t42 in FIG. 8A. In the period corresponding to the first time point t51 to before the fourth time point t54, since the first and second selection signals UP_FLL and DN_FLL have a second logic level and the third selection signal SPD has a first logic level, the first and second switching signals PH2_UP and PH2_DN may have a second logic level, and third switching signal PH2_SPD may be the same as the second phase division signal PH2.

At the fifth time point t55, in response to the rising edge of the inverted sampling voltage SLPb, the first latch signal UP having the first logic level is latched, so that the level of the first selection signal UP_FLL may be changed from the second logic level to the first logic level. Meanwhile, in response to the rising edge of the inverted sampling voltage SLPb, the second latch signal DN having the second logic level is latched, so that the third selection signal SPD may be changed from the first logic level to the second logic level. The second selection signal DN_FLL may have a second logic level.

At the sixth time point t56, the level of the sampling voltage SLP sampled in response to the falling edge of the first phase division signal PH1 may be lower than half (Vdd/2) of the first supply voltage Vdd. In response to the rising edge of the first inverted phase division signal PH1b, the second latch signal DN may have a first logic level. Thereafter, the first latch signal UP and the second latch signal DN may be reset.

At the seventh time point t57, the level of the first latch signal UP may become a first logic level in response to a rising edge of the sampling voltage SLP.

At the eighth time point t58, when a rising edge of the inverted sampling voltage SLPb occurs, since the level of the first latch signal UP is the first logic level and the level of the second latch signal DN is the second logic level, the level of the first selection signal UP_FLL may be a first logic level, and the levels of the second and third selection signals DN_FLL and SPD may be a second logic level.

Since the second and third selection signals DN_FLL and SPD have the second logic level and the first selection signal UP_FLL has the first logic level from the fifth time point t55, the second and third switching signals PH2_DN and PH2_SPD may have a second logic level, and the first switching signal PH2_UP may be the same as the second phase division signal PH2.

Even when the phase difference between the output clock signal CLK_OUT and the reference clock signal CLK_REF is greater than a half cycle of the reference clock signal CLK_REF, it may be predicted that the hold voltage HOLD is greater than the reference voltage (e.g., half (Vdd/2) of the first supply voltage Vdd).

As shown in FIGS. 6 to 8B, the level of any one of the first to third selection signals UP_FLL, DN_FLL, and SPD may be a first logic level, and the levels of the remaining selection signals may be a second logic level. Also, among the first to third switching signals PH2_UP, PH2_DN, and PH2_SPD, a switching signal corresponding to a selection signal having a first logic level may correspond to a second phase division signal.

As shown in FIGS. 7B and 8B, even if the phase of the output clock signal CLK_OUT is excessively ahead of or excessively lagging behind the phase of the reference clock signal CLK_REF, since the hold voltage HOLD may be maintained at the first supply voltage Vdd or the second supply voltage Vss without being affected by the sampling voltage SLP, in the case of feedback control performed later by the transconductance circuit 120 and the loop filter 130, the frequency of the output clock signal CLK_OUT may be set as a target frequency by tracking the frequency of the output clock signal CLK_OUT.

Figure 9:
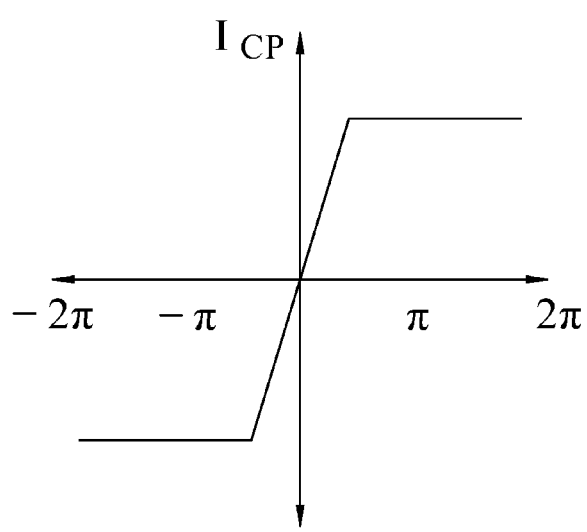
FIG. 9 is a graph for explaining characteristics of a conversion current with respect to a phase difference according to embodiments of the present disclosure.

FIG. 9 is a graph for explaining characteristics of a conversion current with respect to a phase difference according to embodiments of the present disclosure.

Referring to FIG. 9, when the phase difference $\Delta\varphi$ between the output clock signal CLK_OUT and the reference clock signal CLK_REF is 0, the magnitude of the conversion current Icp may be 0. At this time, the main loop may be phase-locked.

When the phase difference $\Delta\varphi$ between the output clock signal CLK_OUT and the reference clock signal CLK_REF is greater than 0, the magnitude of the conversion current Icp may be greater than 0. At this time, as the phase difference $\Delta\varphi$ between the output clock signal CLK_OUT and the reference clock signal CLK_REF gradually increases, the conversion current Icp may also increase.

When the phase difference $\Delta\varphi$ between the output clock signal CLK_OUT and the reference clock signal CLK_REF is smaller than 0, the conversion current Icp may be smaller than 0. In this case, that the conversion current Icp is smaller than 0 may mean that the conversion current Icp flows in the opposite direction. When the phase difference $\Delta\varphi$ between the output clock signal CLK_OUT and the reference clock signal CLK_REF becomes smaller than a certain value, the magnitude of the conversion current Icp may be constant.

According to the foregoing embodiment, even if the phase difference $\Delta\varphi$ between the output clock signal CLK_OUT and the reference clock signal CLK_REF becomes larger than a certain value or smaller than a certain value, since the magnitude of the conversion current Icp is kept constant, the phase and frequency of the output clock signal CLK_OUT may be easily tracked.

Figure 10:
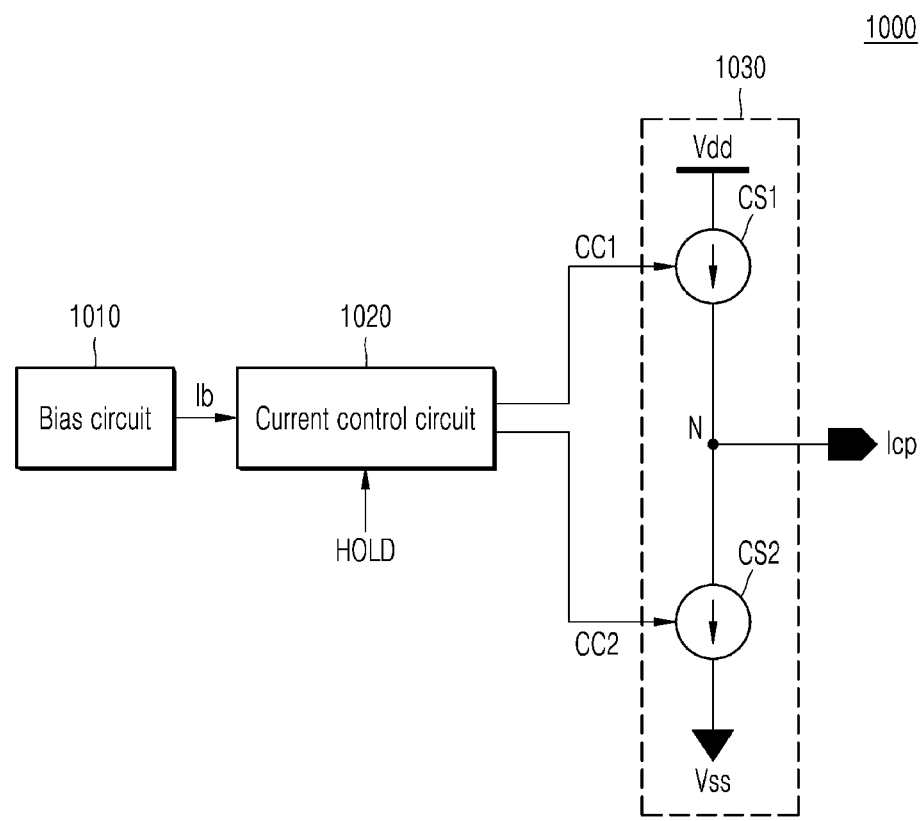
FIG. 10 is a diagram illustrating a transconductance circuit according to an embodiment of the present disclosure.

FIG. 10 is a diagram illustrating a transconductance circuit according to an embodiment of the present disclosure.

Referring to FIG. 10, a transconductance circuit 1000 may include a bias circuit 1010, a current control circuit 1020, and a current providing circuit 1030.

The bias circuit 1010 may provide a constant bias current Ib to the current control circuit 1020. In one embodiment, the number of bias circuits 1010 may be one. However, embodiments are not limited thereto. To increase the magnitude of the bias current Ib, in another embodiment, a plurality of bias circuits 1010 may be included in the transconductance circuit 1000.

The current control circuit 1020 may compare the magnitude of the hold voltage HOLD and the magnitude of the reference voltage. The reference voltage may be, for example, half (Vdd/2) of the first supply voltage Vdd, but is not limited thereto. In one embodiment, the reference voltage may be generated inside the current control circuit 1020. In another embodiment, the current control circuit 1020 may receive a reference voltage from the outside.

According to the result of comparing the magnitude of the hold voltage HOLD and the magnitude of the reference voltage, the current control circuit 1020 may control the current providing circuit 1030 to adjust the conversion current Icp output from the current providing circuit 1030. For example, when the magnitude (or level) of the hold voltage HOLD is the same as that of the reference voltage (i.e., phase lock), the current control circuit 1020 may control the current providing circuit 1030 so that conversion current Icp is not output. In another example, when the magnitude (or level) of the hold voltage HOLD is smaller than the magnitude of the reference voltage (i.e., phase lead), the current control circuit 1020 may control the current providing circuit 1030 so that the conversion current Icp is input to the loop filter 130 (this may be referred to as the forward or positive direction in which the conversion current Icp flows). As another example, when the magnitude (or level) of the hold voltage HOLD is greater than the magnitude of the reference voltage (i.e., phase lag), the current control circuit 1020 may control the current providing circuit 1030 so that conversion current Icp is output from the loop filter 130 (this may be referred to as the reverse or negative direction in which the conversion current Icp flows).

In one embodiment, the number of current control circuits 1020 may be one, but is not limited thereto, and in another embodiment, a plurality of current control circuits 1020 may be included in the transconductance circuit 1000.

The current providing circuit 1030 may include a first current source CS1 and a second current source CS2. The first current source CS1 may be connected between a line to which the first supply voltage Vdd is supplied and the node N. The first current source CS1 may provide a first current (or up current) to the node N. The first current may flow from a line to which the first supply voltage Vdd is supplied to the node N. The second current source CS2 may be connected between a line to which the second supply voltage Vss is supplied and the node N. The second current source CS2 may provide a second current (or down current) from the node N to a line to which the second supply voltage Vss is supplied.

As shown in FIG. 10, according to Kirchhoff's current law, at the node N, the sum of the first current of the first current source CS1, the second current of the second current source CS2, and the conversion current Icp may be zero.

In one embodiment, according to the result of comparing the magnitude of the hold voltage HOLD and the magnitude of the reference voltage, the current control circuit 1020 may provide the first current control signal CC1 and the second current control signal CC2 to the first current source CS1 and the second current source CS2, respectively. The first current control signal CC1 and the second current control signal CC2 may be signals for adjusting the current generated by the first current source CS1 and the second current source CS2, respectively. Alternatively, the first current control signal CC1 and the second current control signal CC2 may be signals representing the magnitudes of currents generated by the first current source CS1 and the second current source CS2, respectively. To match the sum of the magnitude of the current according to the first current control signal CC1 and the magnitude of the current according to the second current control signal CC2 to the bias current Ib, when the magnitude of the current according to the first current control signal CC1 increases, the magnitude of the current according to the second current control signal CC2 may decrease, or when the magnitude of the current according to the first current control signal CC1 decreases, the magnitude of the current according to the second current control signal CC2 may increase. For example, when the bias current Ib is 400 µA, in order that the sum of the magnitude of the current according to the first current control signal CC1 and the magnitude of the current according to the second current control signal CC2 is 400 µA, the amount of change in current according to the first current control signal CC1 and the amount of change in current according to the second current control signal CC2 may be opposite to each other. However, embodiments are not limited thereto.

It is assumed that the bias current Ib is 400 µA in the above-described embodiment. If the hold voltage HOLD is equal to the reference voltage, the current control circuit 1020 may output the first and second current control signals CC1 and CC2 so that the first and second currents are 200 µA, respectively. At this time, the conversion current Icp may be 0 A. On the other hand, if the hold voltage HOLD is greater than the reference voltage, the current control circuit 1020 may output the first current control signal CC1 to the first current source CS1 so that the first current has a value smaller than 200 µA, and may output the second current control signal CC2 to the second current source CS2 so that the second current has a value greater than 200 µA. At this time, the conversion current Icp may flow from the input terminal of the loop filter 130 to the node N according to Kirchhoff's current law. On the other hand, if the hold voltage HOLD is less than the reference voltage, the current control circuit 1020 may output the first current control signal CC1 to the first current source CS1 so that the first current has a value greater than 200 µA, and may output the second current control signal CC2 to the second current source CS2 so that the second current has a value less than 200 µA. At this time, the conversion current Icp may flow from the node N to the input terminal of the loop filter 130 according to Kirchhoff's current law.

When the conversion current Icp flows from the input terminal of the loop filter 130 to the node N, the loop filter 130 may reduce the level of the voltage control signal VCTRL. When the reduced voltage control signal VCTRL is input to the voltage controlled oscillator 140, the phase of the output clock signal CLK_OUT may increase.

When the conversion current Icp flows from the node N to the input terminal of the loop filter 130, the loop filter 130 may increase the level of the voltage control signal VCTRL. When the increased voltage control signal VCTRL is input to the voltage controlled oscillator 140, the phase of the output clock signal CLK_OUT may slow down.

Figure 11:
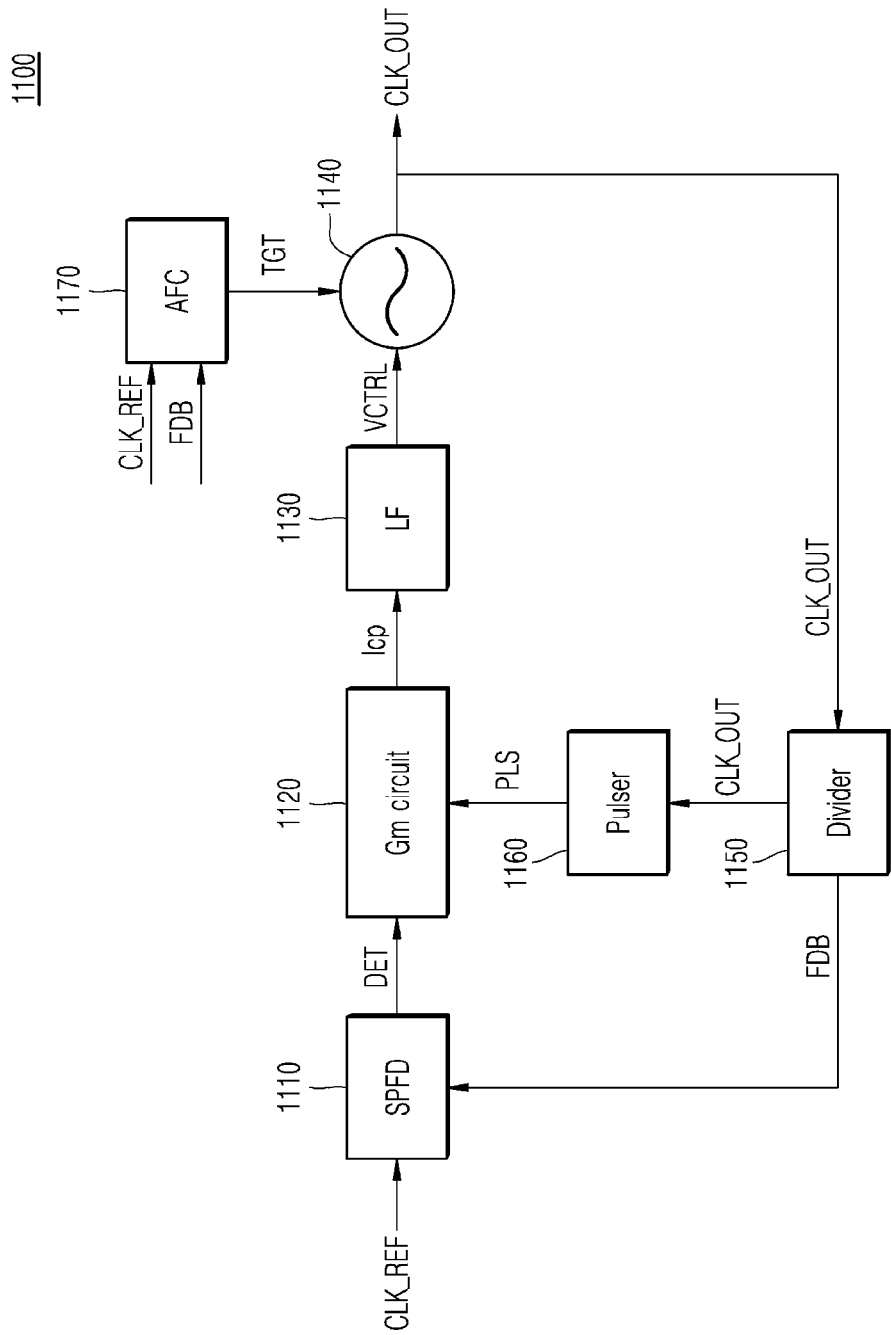
FIG. 11 is a block diagram illustrating a phase-locked loop device according to another embodiment of the present disclosure.

FIG. 11 is a block diagram illustrating a phase-locked loop device according to another embodiment of the present disclosure.

Referring to FIG. 11, the phase-locked loop device 1100 may include a sampling phase frequency detector 1110, a transconductance circuit 1120, a loop filter 1130, a voltage controlled oscillator 1140, a divider 1150, a pulser 1160, and an automatic frequency calibration (AFC) 1170.

The sampling phase frequency detector 1110, the transconductance circuit 1120, the loop filter 1130, the voltage controlled oscillator 1140, and the divider 1150 may be the same as the sampling phase frequency detector 110, the transconductance circuit 120, the loop filter 130, the voltage controlled oscillator 140, and the divider 150 shown in FIG. 1.

The pulser 1160 may provide a pulse signal PLS having a pulse width based on the output clock signal CLK_OUT to the transconductance circuit 1120. The pulser 1160 may also be referred to as a pulse generator. The transconductance circuit 1120 may output a conversion current Icp during a section corresponding to the pulse width of the pulse signal PLS. The conversion current Icp may be adjusted according to the pulse signal PLS of the pulser 1160. If the pulser 1160 is included in the phase-locked loop device 1100, there may be of securing a required bandwidth and phase margin, and reducing phase noise.

In one embodiment, the feedback signal FDB output from the divider 1150 may correspond to the first and second phase division signals PH1 and PH2. In another embodiment, the feedback signal FDB output from the divider 1150 may be a signal obtained by dividing the output clock signal CLK_OUT by N.

The AFC 1170 may generate a target signal TGT for adjusting the frequency of the output clock signal CLK_OUT based on the reference clock signal CLK_REF and the feedback signal FDB.

The sampling phase frequency detector 1110, the transconductance circuit 1120, the loop filter 1130, the voltage controlled oscillator 1140, the divider 1150, the pulser 1160, and the AFC 1170 may be configured as a main loop.

Figure 12:
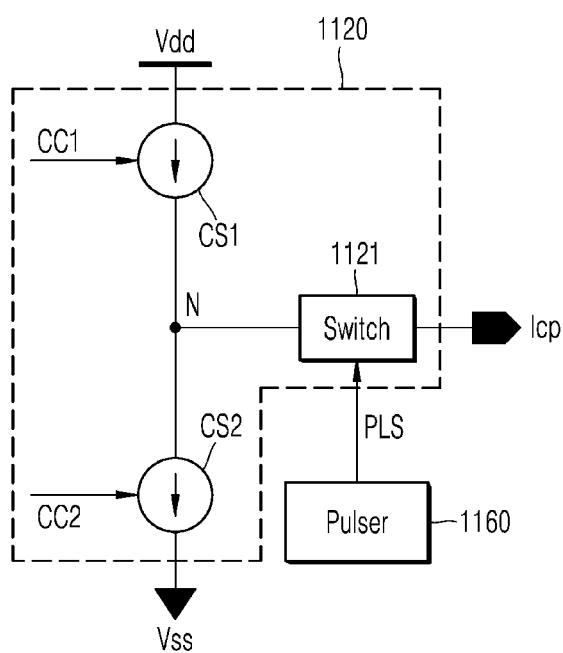
FIG. 12 is a diagram for explaining a transconductance circuit and a pulse generator shown in FIG. 11.

FIG. 12 is a diagram for explaining the transconductance circuit and the pulse generator shown in FIG. 11.

Referring to FIG. 12, the transconductance circuit 1120 may further include a switch 1121 as well as components as described above with reference to FIG. 10. The switch 1121 is connected between the node N and the output terminal from which the conversion current Icp is output, and the switch 1121 may connect the node N to the output terminal in response to the pulse signal PLS output from the pulser 1160. In one embodiment, the switch 1121 may be turned on only during a period in which the pulse signal PLS has a pulse width of a constant logic level, so that a conversion current Icp may be output. The switch 1121 may be implemented as a transistor, but is not limited thereto.

When the switch 1121 is included in the transconductance circuit 1120, effective transconductance of the transconductance circuit 1120 may be reduced. Also, if the switch 1121 is included in the transconductance circuit 1120, the gain of the feedback loop of the phase-locked loop device 1100 may be reduced when the switch 1121 is closed.

Figure 13:
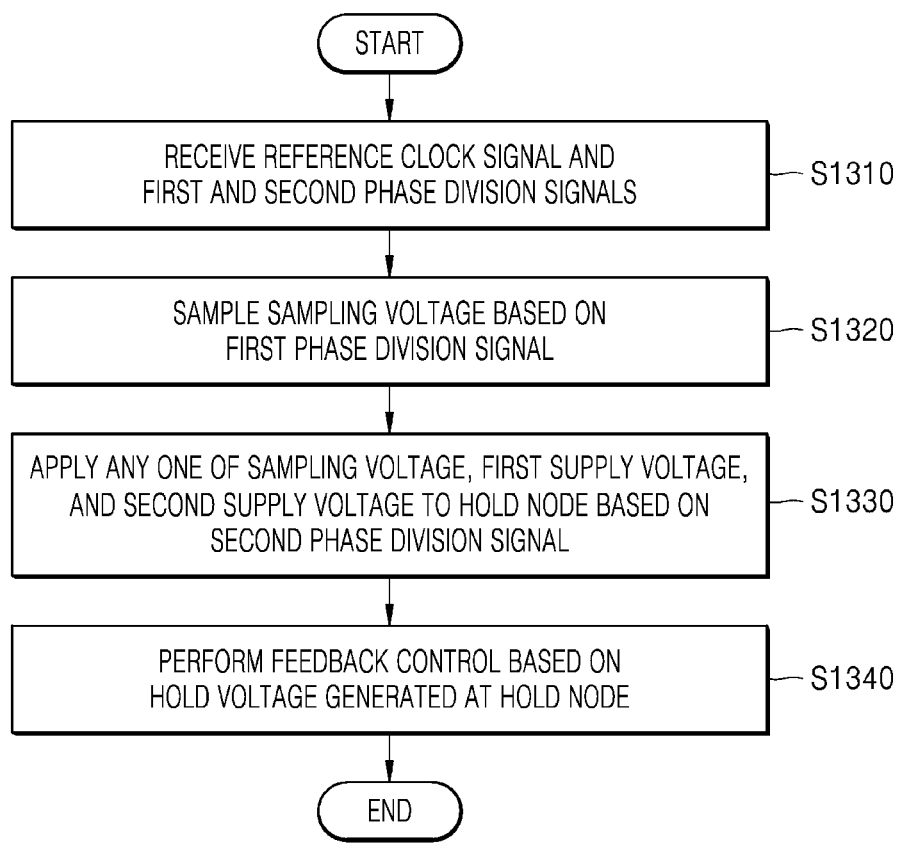
FIG. 13 is a flowchart for explaining a method of operating a phase-locked loop device, according to an embodiment of the present disclosure.

FIG. 13 is a flowchart for explaining a method of operating a phase-locked loop device, according to an embodiment of the present disclosure.

Referring to FIGS. 1, 3, and 13, a method of operating the phase-locked loop device 100 may be a method for synchronizing a reference clock signal with an output clock signal.

In S1310, the sampling phase frequency detector 110 receives a reference clock signal CLK_REF and first and second phase division signals PH1 and PH2 divided from the output clock signal CLK_OUT.

In S1320, the sampling phase frequency detector 110 samples the sampling voltage SLP generated at the sampling node SN according to the reference clock signal CLK_REF based on the first phase division signal PH1. The description of S1320 is given above with reference to FIGS. 3 and 6 to 8B.

In S1330, the sampling phase frequency detector 110 applies one voltage among the sampling voltage SLP, the first supply voltage Vdd, and the second supply voltage Vss to the hold node HN as the hold voltage HOLD based on the second phase division signal PH2. The description of S1330 is given above with reference to FIGS. 3 to 8B.

In step S1340, the transconductance circuit 120, the loop filter 130, the voltage controlled oscillator 140, and the divider 150 perform feedback control for synchronizing the reference clock signal CLK_REF and the output clock signal CLK_OUT based on the hold voltage HOLD. The description of step S1340 is given above with reference to FIGS. 1 and 10.

Figure 14A:
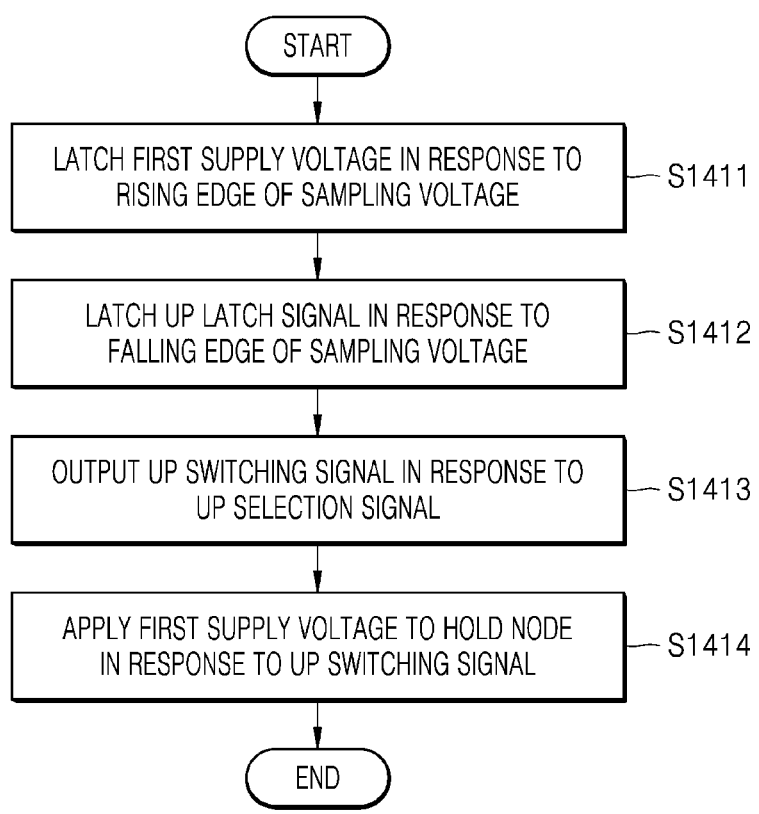
FIGS. 14A, 14B, and 14C are flowcharts illustrating steps of applying a hold voltage to a hold node according to example embodiments.
Figure 14B:
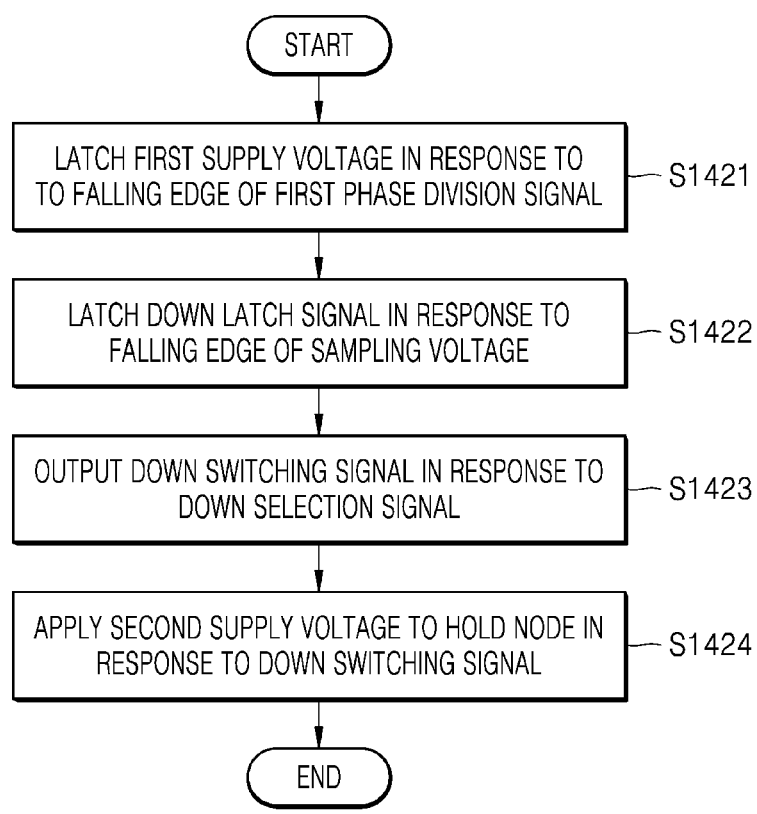
Figure 14C:
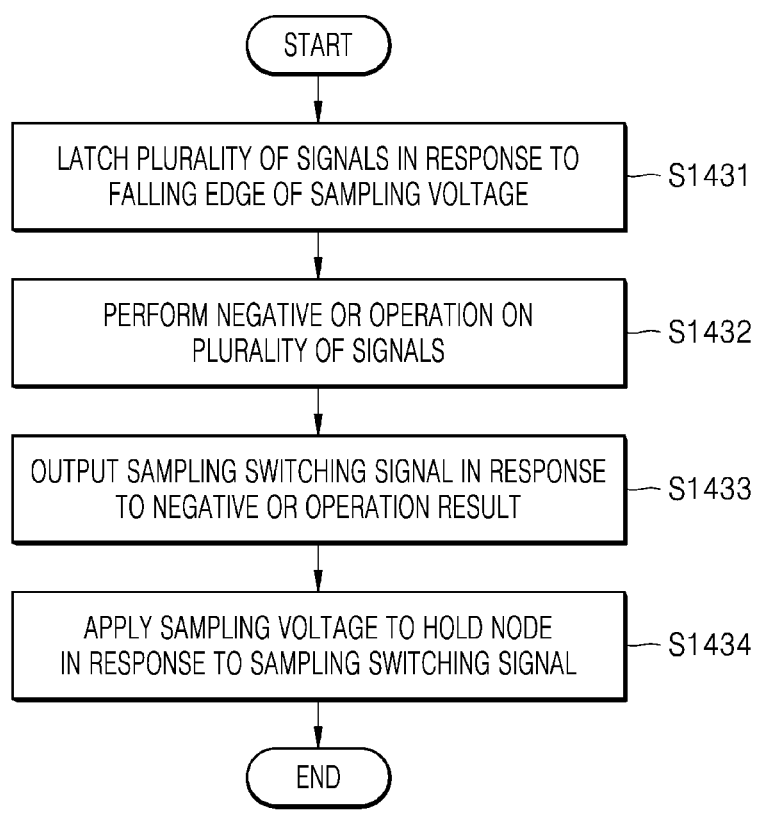

FIGS. 14A, 14B, and 14C are flowcharts illustrating steps of applying a hold voltage to a hold node according to example embodiments. Specifically, FIG. 14A is a flowchart for specifically explaining an operation method of the up switch USW included in the first circuit 300, the first flip-flop FF1 and the third flip-flop FF3 included in the second circuit 400, and the first logical AND gate ANDG1 included in the third circuit 500, FIG. 14B is a flowchart for specifically explaining an operating method of the down switch DSW included in the first circuit 300, the second flip-flop FF2 and the fourth flip-flop FF4 included in the second circuit 400, and the second AND gate ANDG2 included in the third circuit 500, and FIG. 14C is a flowchart for specifically explaining an operation method of the second switch SW2 included in the first circuit 300, the third flip-flop FF3, the fourth flip-flop FF4, and the negative OR gate NORG included in the second circuit 400, and the third AND gate ANDG3 included in the third circuit 500.

Referring to FIGS. 3, 4, 5, 13, and 14A, S1330 according to an embodiment may include S1411 to S1414.

In S1411, the first flip-flop FF1 latches the first supply voltage Vdd in response to the rising edge of the sampling voltage SLP and outputs an up-latch signal having a first logic level. Here, the up latch signal may be the first latch signal UP described above with reference to FIG. 4.

In S1412, the third flip-flop FF3 latches the up latch signal in response to the falling edge of the sampling voltage SLP and outputs an up selection signal having a first logic level. Here, the up selection signal may be the first selection signal UP_FLL described above with reference to FIG. 4. The falling edge of the sampling voltage SLP may be the same as the rising edge of the inverted sampling voltage SLPb.

In S1413, the first AND gate ANDG1 outputs an up-switching signal corresponding to the phase of the second phase division signal PH2 in response to the up selection signal. Here, the up switching signal may be the first switching signal PH2_UP described above with reference to FIG. 4.

In S1414, the up switch USW is turned on in response to the up switching signal, so that the first supply voltage Vdd is applied to the hold node HN.

Referring to FIGS. 3, 4, 5, 13, and 14B, S1330 according to another embodiment may include S1421 to S1424.

In S1421, the second flip-flop FF2 latches the first supply voltage Vdd in response to the falling edge of the first phase division signal PH1, and outputs a down latch signal having a first logic level. Here, the down latch signal may be the second latch signal DN described above with reference to FIG. 4. The falling edge of the first phase division signal PH1 may be the same as the rising edge of the first inverted phase division signal PH1b.

In S1422, the fourth flip-flop FF4 latches the down latch signal in response to the falling edge of the sampling voltage SLP and outputs a down selection signal having a first logic level. Here, the down selection signal may be the second selection signal DN_FLL described above with reference to FIG. 4.

In S1423, the second AND gate ANDG2 outputs a down switching signal corresponding to the phase of the second phase division signal PH2 in response to the down selection signal. Here, the down switching signal may be the second switching signal PH2_DN described above with reference to FIG. 4.

In S1424, the down switch DSW is turned on in response to the down switching signal, so that the second supply voltage Vss is applied to the hold node HN.

Referring to FIGS. 3, 4, 5, 13, and 14C, S1330 according to another embodiment may include S1431 to S1434.

In S1431, the third flip-flop FF3 and the fourth flip-flop FF4 latch a plurality of signals having a second logic level lower than the first logic level in response to the falling edge of the sampling voltage SLP. Here, the plurality of signals may include, for example, an up latch signal and a down latch signal.

In step S1432, the negative OR gate NORG performs a negative OR operation on the up latch signal and the down latch signal. Then, the negative OR gate NORG outputs an output signal indicating a result of the negative OR operation.

In S1433, the third AND gate ANDG3 outputs a sampling switching signal corresponding to the phase of the second phase division signal PH2 in response to the output signal.

In S1434, the second switch SW2 is turned on in response to the sampling switching signal, and the sampling voltage SLP is applied to the hold node HN.

Figure 15:
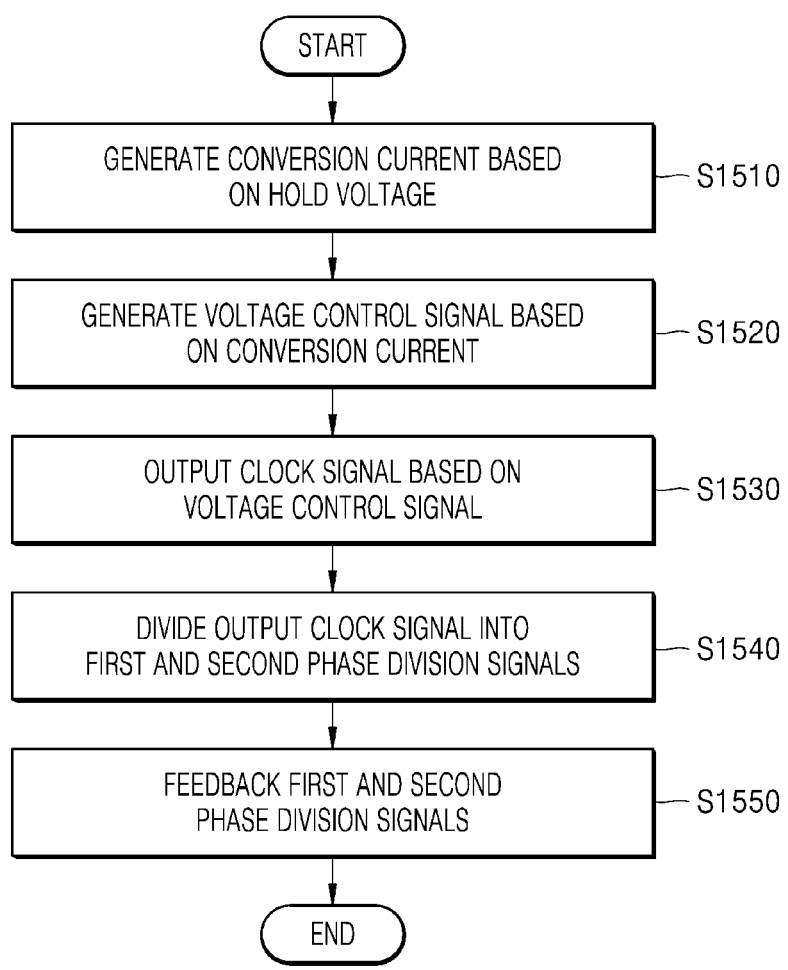
FIG. 15 is a flowchart for explaining in detail a feedback control step according to an embodiment of the present disclosure.

FIG. 15 is a flowchart for explaining in detail a feedback control step according to an embodiment of the present disclosure. Specifically, FIG. 15 is a flowchart for explaining the operation method of the transconductance circuit 120, the loop filter 130, the voltage controlled oscillator 140, and the divider 150 in detail.

Referring to FIGS. 1, 13 and 15, operation S1340 may include S1510 to S1550.

In S1510, the transconductance circuit 120 generates a conversion current Icp based on the hold voltage HOLD.

In S1520, the loop filter 130 generates a voltage control signal VCTRL based on the conversion current Icp.

In S1530, the voltage controlled oscillator 140 outputs an output clock signal CLK_OUT based on the voltage control signal VCTRL.

In S1540, the divider 150 divides the output clock signal CLK_OUT into first and second phase division signals PH1 and PH2. In S1550, the divider 150 feeds back the first and second phase division signals PH1 and PH2 to the sampling phase frequency detector 110.

Figure 16:
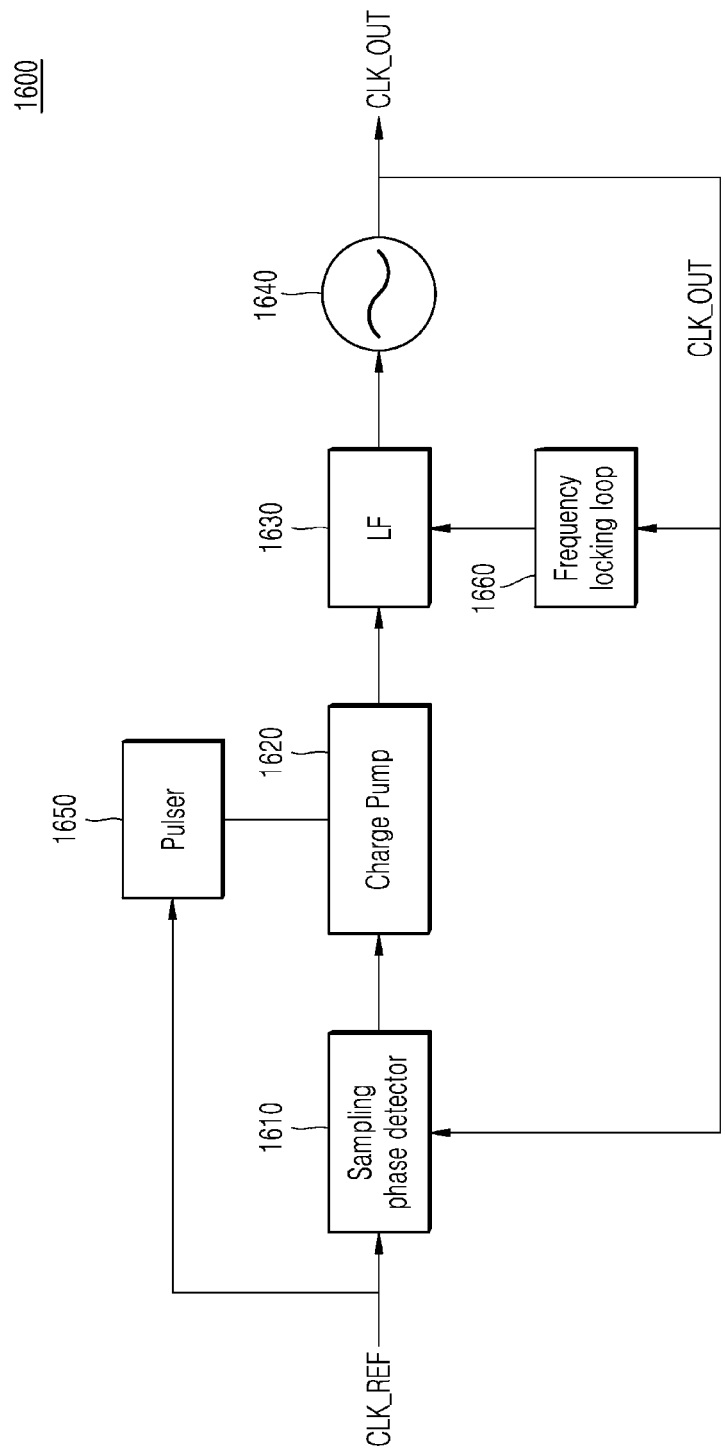
FIG. 16 is a block diagram illustrating a phase-locked loop device according to a comparative example.

FIG. 16 is a block diagram illustrating a phase-locked loop device according to a comparative example.

Referring to FIG. 16, a phase-locked loop device 1600 according to a comparative example may be referred to as a sampling phase-locked loop. The phase-locked loop device 1600 may include a sampling phase detector 1610, a charge pump 1620, a loop filter 1630, a voltage controlled oscillator 1640, a pulser 1650, and a frequency locking loop 1660.

The sampling phase detector 1610 may sample a voltage generated according to the reference clock signal CLK_REF and detect a phase difference between the reference clock signal CLK_REF and the output clock signal CLK_OUT based on the sampled voltage.

The charge pump 1620 may generate current based on a result detected by the sampling phase detector 1610. Noise generated from the phase-locked loop device 1600 may be reduced as the magnitude of the current output from the charge pump 1620 is reduced.

The loop filter 1630 may generate a voltage control signal for controlling the voltage controlled oscillator 1640 based on the current generated by the charge pump 1620.

The voltage controlled oscillator 1640 may output an output clock signal CLK_OUT based on the voltage control signal.

The pulser 1650 may generate a pulse signal for controlling the output of the charge pump 1620 based on the reference clock signal CLK_REF. The charge pump 1620 may output current only during a period corresponding to the pulse width of the pulse signal.

The sampling phase detector 1610, charge pump 1620, loop filter 1630, voltage controlled oscillator 1640, and pulser 1650 may be configured as a main loop.

The frequency locking loop 1660 may assist in fixing the frequency of the output clock signal CLK_OUT to a target frequency.

A current output from the charge pump 1620 may affect a lock range of the phase-locked loop device 1600 for achieving phase lock. For example, as the magnitude of current output from the charge pump 1620 increases, a lock range of the phase-locked loop device 1600 may widen. However, to reduce noise generated by the phase-locked loop device 1600, a small current output from the charge pump 1620 is used, and accordingly, the fixing range of the phase-locked loop device 1600 is narrowed.

Meanwhile, when the phase of the output clock signal CLK_OUT is excessively leading or excessively lagging the phase of the reference clock signal CLK_REF, the sampling phase detector 1610 may repeatedly sample a voltage higher than or lower than the reference voltage. Accordingly, the phase of the output clock signal CLK_OUT repeatedly precedes or lags behind the phase of the reference clock signal CLK_REF, and phase lock is impossible.

To secure the fixed range and phase lock of the phase-locked loop device 1600, the phase-locked loop device 1600 includes a frequency locking loop 1660, and when the phase-locked loop device 1600 includes the frequency locking loop 1660, the integrated size increases.

Accordingly, the phase-locked loop devices 100 and 1100 according to embodiments of the present disclosure may sufficiently secure the fixed range of the phase-locked loop device and stably achieve phase lock only with the main loop. In addition, the phase-locked loop devices 100 and 1100 according to embodiments of the present disclosure may promote device integration by omitting the frequency locking loop 1660. In addition, the phase-locked loop device 1100 according to an embodiment of the present disclosure may secure a required bandwidth and phase margin and reduce phase noise.

Figure 17:
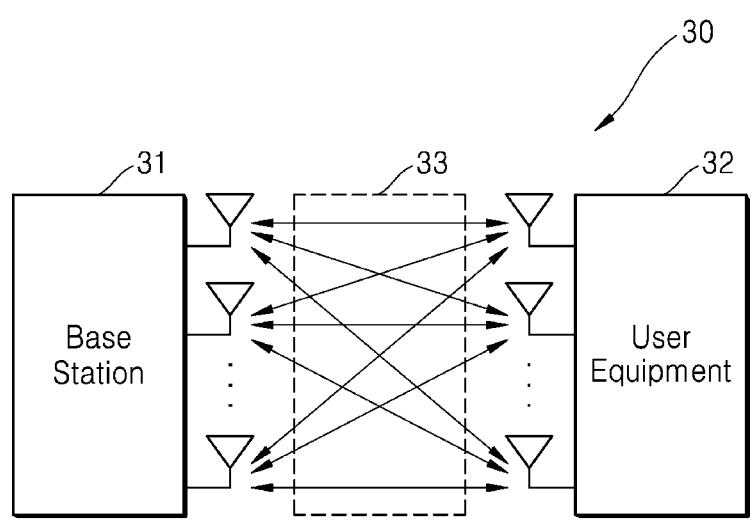
FIG. 17 is a block diagram illustrating a wireless communication system according to an embodiment of the present disclosure.

FIG. 17 is a block diagram illustrating a wireless communication system according to an embodiment of the present disclosure. Specifically, FIG. 17 shows an example of wireless communication between a base station 31 and a user equipment 32 in a wireless communication system 30 using a cellular network. The wireless communication system 30 may define a high carrier frequency, and the base station 31 and user equipment 32 may include devices according to embodiments of the present disclosure described above.

A base station 31 may be a fixed station that communicates with user equipment and/or other base stations. For example, the base station 31 may be referred to as a Node B, an evolved-Node B (eNB), a sector, a site, a base transceiver system (BTS), an access point (AP), a relay node, a remote radio head (RRH), a radio unit (RU), a small cell, and the like. The user equipment 32 may be fixed or mobile, and may transmit and receive data and/or control information by communicating with a base station. For example, the user equipment 32 may be referred to as a terminal equipment, a mobile station (MS), a mobile terminal (MT), a user terminal (UT), a subscriber station (SS), a wireless device, a handheld device, and the like. As shown in FIG. 17, the base station 31 and the user equipment 32 may each include a plurality of antennas, and may perform wireless communication through a Multiple Input Multiple Output (MIMO) channel 33.

While certain embodiments have been particularly shown and described, it will be understood that various changes in form and details may be made therein without departing from the spirit and scope of the following claims.

What is claimed is:

1. A phase-locked loop device comprising:
    a voltage controlled oscillator configured to generate an output clock signal;
    a divider configured to divide the output clock signal into a first phase division signal and a second phase division signal, the first phase division signal and the second phase division signal having a constant phase difference;
    a sampling phase frequency detector configured to sample, based on the first phase division signal, a sampling voltage generated at a sampling node according to a reference clock signal and output, based on the second phase division signal, any one of the sampling voltage, a first supply voltage, and a second supply voltage having a lower level than the first supply voltage to a hold node;
    a transconductance circuit configured to output a conversion current based on a hold voltage generated at the hold node; and
    a loop filter configured to generate a voltage control signal based on the conversion current and output the voltage control signal to the voltage controlled oscillator.

2. The phase-locked loop device of claim 1, wherein the sampling phase frequency detector comprises:
    a first circuit configured to receive the reference clock signal and the first phase division signal and output the sampling voltage and the hold voltage;
    a second circuit configured to receive a first inverted phase division signal obtained by inverting the first phase division signal, an inverted sampling voltage obtained by inverting the sampling voltage, and the sampling voltage, and output a first selection signal, a second selection signal, and a third selection signal; and
    a third circuit configured to receive the first selection signal, the second selection signal and the third selection signal and the second phase division signal and output a first switching signal, a second switching signal, and a third switching signal for respectively selecting one of the sampling voltage, the first supply voltage, and the second supply voltage to the first circuit.

3. The phase-locked loop device of claim 2, wherein the first circuit comprises:
    a sampling phase detection circuit configured to sample a voltage generated at the sampling node based on the first phase division signal and transfer the sampling voltage to the hold node as the hold voltage based on the third switching signal;
    an up switch configured to transfer the first supply voltage as the hold voltage to the hold node based on the first switching signal; and a down switch configured to transfer the second supply voltage as the hold voltage to the hold node based on the second switching signal.

4. The phase-locked loop device of claim 3, wherein the sampling phase detection circuit comprises:
a first transistor configured to transfer the first supply voltage to the sampling node based on the reference clock signal;
a second transistor configured to transfer the second supply voltage to the sampling node based on the reference clock signal;
a first switch configured to connect the sampling node to a charge node based on the first phase division signal;
a first capacitor configured to store a first charge corresponding to a first difference between a first voltage generated at the charge node and the second supply voltage;
a second switch configured to connect the charge node to the hold node based on the third switching signal; and
a second capacitor configured to store a second charge corresponding to a second difference between a second voltage generated at the hold node and the second supply voltage.

5. The phase-locked loop device of claim 2, wherein the second circuit comprises:
a first flip-flop configured to latch the first supply voltage based on the sampling voltage and output a first latch signal;
a second flip-flop configured to latch the first supply voltage based on the first inverted phase division signal and output a second latch signal;
an AND gate configured to perform an AND operation on the first latch signal and the second latch signal, and transfer an output signal indicating a result of the AND operation to a first reset terminal of the first flip-flop and a second reset terminal of the second flip-flop;
a third flip-flop configured to latch the first latch signal based on the inverted sampling voltage and output the first selection signal;
a fourth flip-flop configured to latch the second latch signal based on the inverted sampling voltage and output the second selection signal; and
a negative OR gate configured to perform a NOR operation on the first selection signal and the second selection signal and output the third selection signal.

6. The phase-locked loop device of claim 2, wherein the third circuit comprises:
a first AND gate configured to output the first switching signal by performing an AND operation on the second phase division signal and the first selection signal;
a second AND gate configured to output the second switching signal by performing an AND operation on the second phase division signal and the second selection signal; and
a third AND gate configured to output the third switching signal by performing an AND operation on the second phase division signal and the third selection signal.

7. The phase-locked loop device of claim 2, wherein, when the sampling voltage corresponds to half of the first supply voltage at an edge where the first phase division signal changes from a first logic level to a second logic level, the third switching signal among the first switching signal, the second switching signal, and the third switching signal corresponds to the second phase division signal.

8. The phase-locked loop device of claim 2, wherein the first selection signal corresponds to the first switching signal, the second selection signal corresponds to the second switching signal, and the third selection signal corresponds to the third switching signal,
wherein an active selection signal among the first selection signal, the second selection signal, and the third selection signal has an active logic level, and other two among the first selection signal, the second selection signal, and the third selection signal have an inactive logic level, and
wherein the active selection signal routes the second phase division signal to be an active switching signal among the first switching signal, the second switching signal, and the third switching signal, the active switching signal configured to close a switch connected to the hold node.

9. The phase-locked loop device of claim 1, wherein the transconductance circuit comprises:
a current providing circuit comprising a first current source and a second current source connected to a node from which the conversion current is output; and
a current control circuit configured to compare the hold voltage with a reference voltage and provide a first current control signal and a second current control signal to the first current source and the second current source, respectively, for controlling currents generated by the first current source and the second current source, respectively, according to a comparison result.

10. The phase-locked loop device of claim 1, further comprising a pulse generator configured to provide a pulse signal having a pulse width based on the output clock signal to the transconductance circuit, and
wherein the transconductance circuit is configured to output the conversion current in a section corresponding to the pulse width.

11. An operating method of a phase-locked loop device that synchronizes a reference clock signal with an output clock signal, the operating method comprising:
receiving the reference clock signal and first and second phase division signals, divided from the output clock signal;
sampling, based on the first phase division signal, a sampling voltage generated at a sampling node according to the reference clock signal;
applying, based on the second phase division signal, any one of the sampling voltage, a first supply voltage, and a second supply voltage lower than the first supply voltage as a hold voltage to a hold node; and
performing feedback control for synchronizing the reference clock signal with the output clock signal based on the hold voltage.

12. The operating method of claim 11, wherein the applying the hold voltage to the hold node comprises:
latching the first supply voltage based on a rising edge of the sampling voltage and outputting an up latch signal having a first logic level;
latching the up latch signal based on a falling edge of the sampling voltage and outputting an up selection signal having the first logic level;
outputting an up switching signal corresponding to a phase of the second phase division signal based on the up selection signal; and
applying the first supply voltage to the hold node based on the up switching signal.

13. The operating method of claim 11, wherein the applying of the hold voltage to the hold node comprises:

latching the first supply voltage based on a falling edge of the first phase division signal and outputting a down latch signal having a first logic level;

latching the down latch signal based on a falling edge of the sampling voltage and outputting an down selection signal having the first logic level;

outputting a down switching signal corresponding to a phase of the second phase division signal based on the down selection signal; and applying the second supply voltage to the hold node based on the down switching signal.

14. The operating method of claim 11, wherein the applying the hold voltage to the hold node comprises:

latching an up latch signal and a down latch signal each having a second logic level lower than a first logic level based on a falling edge of the sampling voltage;

performing an NOR operation on the up latch signal and the down latch signal and outputting an output signal representing a NOR operation result;

outputting a sampling switching signal corresponding to a phase of the second phase division signal based on the output signal; and applying the sampling voltage to the hold node based on the sampling switching signal.

15. The operating method of claim 11, wherein the performing the feedback control comprises:

generating a conversion current based on the hold voltage;

generating a voltage control signal based on the conversion current;

outputting the output clock signal based on the voltage control signal; and dividing the output clock signal into the first and second phase division signals.

16. A phase-locked loop circuit for synchronizing a reference clock signal with an output clock signal, the phase-locked loop circuit comprising:

a first circuit including a sampling phase detection circuit connected between an input node to which the reference clock signal is input and a hold node, an up switch connected between a first node to which a first supply voltage is applied and the hold node, and a down switch connected between a second node to which a second supply voltage is applied and the hold node;

a second circuit connected between a first input terminal to which a sampling voltage is input, a second input terminal to which a first phase division signal divided from the output clock signal is input, a third input terminal to which an inverted sampling voltage obtained by inverting the sampling voltage is input, a first terminal from which a first selection signal is output, a second terminal from which a second selection signal is output, and a third terminal from which a third selection signal is output; and a third circuit connected between an input terminal to which a second phase division signal divided from the output clock signal is input, a plurality of input terminals to which the first selection signal, the second selection signal and the third selection signal are respectively input, and a plurality of output terminals from which a first switching signal, a second switching signal, and a third switching signal are respectively output.

17. The phase-locked loop circuit of claim 16, wherein the sampling phase detection circuit comprises:

a first transistor connected between a third node to which the first supply voltage is applied and a sampling node where the sampling voltage is generated, the first transistor comprising a first gate electrode to which the reference clock signal is input;

a second transistor connected between a fourth node to which the second supply voltage is applied and the sampling node, the second transistor comprising a second gate electrode to which the reference clock signal is input;

a first switch connected between the sampling node and a charge node;

a first capacitor connected between the second node to which the second supply voltage is applied and the charge node;

a second switch connected between the charge node and the hold node; and a second capacitor connected between the second node to which the second supply voltage is applied and the hold node.

18. The phase-locked loop circuit of claim 16, wherein the second circuit comprises:

a first flip-flop including a first clock terminal to which the sampling voltage is input, a fourth input terminal to which the first supply voltage is input, and a first flip-flop output terminal from which a first latch signal is output;

a second flip-flop including a second clock terminal to which a first inverted phase division signal obtained by inverting the first phase division signal is input, a fifth input terminal to which the first supply voltage is input, and a second flip-flop output terminal from which a second latch signal is output;

an AND gate comprising a plurality of input terminals to which the first latch signal and the second latch signal are input, and a first output terminal connected to a first reset terminal of the first flip-flop and to a second reset terminal of the second flip-flop;

a third flip-flop comprising a third clock terminal to which the inverted sampling voltage is input, a sixth input terminal to which the first latch signal is input, and a third flip-flop output terminal from which the first selection signal is output;

a fourth flip-flop including a fourth clock terminal to which the inverted sampling voltage is input, a seventh input terminal to which the second latch signal is input, and a fourth flip-flop output terminal from which the second selection signal is output; and a negative OR gate comprising a plurality of input terminals to which the first selection signal and the second selection signal are input, and a second output terminal from which the third selection signal is output.

19. The phase-locked loop circuit of claim 16, wherein the third circuit comprises:

a first AND gate comprising a plurality of input terminals to which the second phase division signal and the first selection signal are input, and a first AND output terminal from which the first switching signal is output;

a second AND gate comprising a plurality of input terminals to which the second phase division signal and the second selection signal are input, and a second AND output terminal from which the second switching signal is output; and a third AND gate comprising a plurality of input terminals to which the second phase division signal and the third selection signal are input, and a third AND output terminal from which the third switching signal is output.

20. The phase-locked loop circuit of claim 16, wherein the first selection signal corresponds to the first switching signal, the second selection signal corresponds to the second switching signal, and the third selection signal corresponds to the third switching signal, wherein an active selection signal among the first selection signal, the second selection signal, and the third selection signal is an active logic level, and the other two among the first selection signal, the second selection signal, and the third selection signal are not the active logic level, and wherein, the active selection signal routes the second phase division signal to be an active switching signal among the first switching signal, the second switching signal, and the third switching signal, the active switching signal configured to close a switch connected to the hold node.

* * * * *